United States Patent
Hansen et al.

(10) Patent No.: US 10,527,746 B2
(45) Date of Patent: Jan. 7, 2020

(54) ARRAY OF UAVS WITH MAGNETOMETERS

(71) Applicant: Lockheed Martin Corporation, Bethesda, MD (US)

(72) Inventors: Jay Hansen, Bethesda, MD (US); John B. Stetson, Jr., Bethesda, MD (US); Michael DiMario, Bethesda, MD (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 72 days.

(21) Appl. No.: 15/443,422

(22) Filed: Feb. 27, 2017

(65) Prior Publication Data

US 2018/0348393 A1 Dec. 6, 2018

Related U.S. Application Data

(60) Provisional application No. 62/343,842, filed on May 31, 2016, provisional application No. 62/343,839, (Continued)

(51) Int. Cl.
*G01V 3/08* (2006.01)
*G01R 33/00* (2006.01)
(Continued)

(52) U.S. Cl.
CPC .............. *G01V 3/081* (2013.01); *G01D 5/14* (2013.01); *G01R 33/00* (2013.01); *G01R 33/02* (2013.01);
(Continued)

(58) Field of Classification Search
CPC ......... G01V 3/081; G01D 5/14; G01R 33/032
See application file for complete search history.

(56) References Cited

U.S. PATENT DOCUMENTS 2,746,027 A 5/1956 Murray
3,359,812 A 12/1967 Everitt
(Continued)

FOREIGN PATENT DOCUMENTS

CN 105738845 A 7/2016
CN 106257602 12/2016
(Continued)

OTHER PUBLICATIONS

Bui et al., "Noninvasive Fault Monitoring of Electrical Machines by Solving the Steady-State Magnetic Inverse Problem," in IEEE Transactions on Magnetics, vol. 44, No. 6, pp. 1050-1053, Jun. 24, 2008.

(Continued)

*Primary Examiner* — Dominic E Hawkins
(74) *Attorney, Agent, or Firm* — Foley & Lardner LLP

(57) ABSTRACT

A system includes a plurality of magnetometers that are each configured to generate a vector measurement of a magnetic field. The system also includes a central processing unit that is communicatively coupled to each of the magnetometers. The central processing unit is configured to receive from each of the plurality of magnetometers the respective vector measurement of the magnetic field. The central processing unit is further configured to compare each of the vector measurements to determine differences in the vector measurements and to determine, based on the differences in the vector measurements, that a magnetic object is near the plurality of magnetometers.

20 Claims, 9 Drawing Sheets

Related U.S. Application Data filed on May 31, 2016, provisional application No. 62/343,600, filed on May 31, 2016.

(51) Int. Cl.

| | | |
|---|---|---|
| *G01R 33/02* | (2006.01) | |
| *G01R 33/022* | (2006.01) | |
| *G01V 3/16* | (2006.01) | |
| *G01D 5/14* | (2006.01) | |
| *G01R 33/032* | (2006.01) | |

(52) U.S. Cl.
CPC ............. *G01R 33/022* (2013.01); *G01V 3/16* (2013.01); *G01R 33/032* (2013.01)

(56) References Cited

U.S. PATENT DOCUMENTS

| | | |
|---|---|---|
| 3,389,333 A | 6/1968 | Wolff et al. |
| 3,490,032 A | 1/1970 | Zurflueh |
| 3,514,723 A | 5/1970 | Cutler |
| 3,518,531 A | 6/1970 | Huggett |
| 3,621,380 A | 11/1971 | Barlow, Jr. |
| 3,745,452 A | 7/1973 | Osburn et al. |
| 3,899,758 A | 8/1975 | Maier et al. |
| 4,025,873 A | 5/1977 | Chilluffo |
| 4,047,805 A | 9/1977 | Sekimura |
| 4,078,247 A | 3/1978 | Albrecht |
| 4,084,215 A | 4/1978 | Willenbrock |
| 4,322,769 A | 3/1982 | Cooper |
| 4,329,173 A | 5/1982 | Culling |
| 4,359,673 A | 11/1982 | Bross et al. |
| 4,368,430 A | 1/1983 | Dale et al. |
| 4,410,926 A | 10/1983 | Hafner et al. |
| 4,437,533 A | 3/1984 | Bierkarre et al. |
| 4,514,083 A | 4/1985 | Fukuoka |
| 4,588,993 A | 5/1986 | Babij et al. |
| 4,636,612 A | 1/1987 | Cullen |
| 4,638,324 A | 1/1987 | Hannan |
| 4,675,522 A | 6/1987 | Arunkumar |
| 4,768,962 A | 9/1988 | Kupfer et al. |
| 4,818,990 A | 4/1989 | Fernandes |
| 4,820,986 A | 4/1989 | Mansfield et al. |
| 4,945,305 A | 7/1990 | Blood |
| 4,958,328 A | 9/1990 | Stubblefield |
| 4,982,158 A | 1/1991 | Nakata et al. |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,200,855 A | 4/1993 | Meredith et al. |
| 5,210,650 A | 5/1993 | O'Brien et al. |
| 5,245,347 A | 9/1993 | Bonta et al. |
| 5,252,912 A | 10/1993 | Merritt et al. |
| 5,301,096 A | 4/1994 | Klontz et al. |
| 5,384,109 A | 1/1995 | Klaveness et al. |
| 5,396,802 A | 3/1995 | Moss |
| 5,420,549 A | 5/1995 | Prestage |
| 5,425,179 A | 6/1995 | Nickel et al. |
| 5,427,915 A | 6/1995 | Ribi et al. |
| 5,548,279 A | 8/1996 | Gaines |
| 5,568,516 A | 10/1996 | Strohallen et al. |
| 5,586,069 A | 12/1996 | Dockser |
| 5,597,762 A | 1/1997 | Popovici et al. |
| 5,638,472 A | 6/1997 | Van Delden |
| 5,694,375 A | 12/1997 | Woodall |
| 5,719,497 A | 2/1998 | Veeser et al. |
| 5,731,996 A | 3/1998 | Gilbert |
| 5,764,061 A | 6/1998 | Asakawa et al. |
| 5,818,352 A | 10/1998 | McClure |
| 5,846,708 A | 12/1998 | Hollis et al. |
| 5,888,925 A | 3/1999 | Smith et al. |
| 5,894,220 A | 4/1999 | Wellstood et al. |
| 5,907,420 A | 5/1999 | Chraplyvy et al. |
| 5,907,907 A | 6/1999 | Ohtomo et al. |
| 5,915,061 A | 6/1999 | Vanoli |
| 5,995,696 A | 11/1999 | Miyagi et al. |
| 6,042,249 A | 3/2000 | Spangenberg |
| 6,057,684 A | 5/2000 | Murakami et al. |
| 6,064,210 A | 5/2000 | Sinclair |
| 6,121,053 A | 9/2000 | Kolber et al. |
| 6,124,862 A | 9/2000 | Boyken et al. |
| 6,130,753 A | 10/2000 | Hopkins et al. |
| 6,144,204 A | 11/2000 | Sementchenko |
| 6,195,231 B1 | 2/2001 | Sedlmayr et al. |
| 6,215,303 B1 | 4/2001 | Weinstock et al. |
| 6,262,574 B1 | 7/2001 | Cho et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,437,563 B1 | 8/2002 | Simmonds et al. |
| 6,472,651 B1 | 10/2002 | Ukai |
| 6,472,869 B1 | 10/2002 | Upschulte et al. |
| 6,504,365 B2 | 1/2003 | Kitamura |
| 6,518,747 B2 | 2/2003 | Sager et al. |
| 6,542,242 B1 | 4/2003 | Yost et al. |
| 6,621,377 B2 | 9/2003 | Osadchy et al. |
| 6,621,578 B1 | 9/2003 | Mizoguchi |
| 6,636,146 B1 | 10/2003 | Wehoski |
| 6,686,696 B2 | 2/2004 | Mearini et al. |
| 6,690,162 B1 | 2/2004 | Schopohl et al. |
| 6,765,487 B1 | 7/2004 | Holmes et al. |
| 6,788,722 B1 | 9/2004 | Kennedy et al. |
| 6,809,829 B1 | 10/2004 | Takata et al. |
| 7,118,657 B2 | 10/2006 | Golovchenko et al. |
| 7,221,164 B1 | 5/2007 | Barringer |
| 7,277,161 B2 | 10/2007 | Claus |
| 7,305,869 B1 | 12/2007 | Berman et al. |
| 7,307,416 B2 | 12/2007 | Islam et al. |
| 7,342,399 B1 * | 3/2008 | Wiegert ............... G01P 3/66 324/207.11 |
| RE40,343 E | 5/2008 | Anderson |
| 7,400,142 B2 | 7/2008 | Greelish |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,570,050 B2 | 8/2009 | Sugiura |
| 7,608,820 B1 | 10/2009 | Berman et al. |
| 7,705,599 B2 | 4/2010 | Strack et al. |
| 7,741,936 B1 | 6/2010 | Weller et al. |
| 7,805,030 B2 | 9/2010 | Bratkovski et al. |
| 7,868,702 B2 | 1/2011 | Ohnishi |
| 7,889,484 B2 | 2/2011 | Choi |
| 7,916,489 B2 | 3/2011 | Okuya |
| 7,932,718 B1 * | 4/2011 | Wiegert ............... G01V 3/081 324/245 |
| 7,983,812 B2 | 7/2011 | Potter |
| 8,022,693 B2 | 9/2011 | Meyersweissflog |
| 8,120,351 B2 | 2/2012 | Rettig et al. |
| 8,120,355 B1 | 2/2012 | Stetson |
| 8,124,296 B1 | 2/2012 | Fischel |
| 8,138,756 B2 | 3/2012 | Barclay et al. |
| 8,193,808 B2 | 6/2012 | Fu et al. |
| 8,294,306 B2 | 10/2012 | Kumar et al. |
| 8,310,251 B2 | 11/2012 | Orazem |
| 8,311,767 B1 | 11/2012 | Stetson |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 * | 11/2013 | Wiegert ............... G01R 33/028 324/244 |
| 8,686,377 B2 | 4/2014 | Twitchen et al. |
| 8,704,546 B2 | 4/2014 | Konstantinov |
| 8,758,509 B2 | 6/2014 | Twitchen et al. |
| 8,803,513 B2 | 8/2014 | Hosek et al. |
| 8,854,839 B2 | 10/2014 | Cheng et al. |

(56) References Cited

U.S. PATENT DOCUMENTS

| | | |
|---|---|---|
| 8,885,301 B1 | 11/2014 | Heidmann |
| 8,913,900 B2 | 12/2014 | Lukin et al. |
| 8,933,594 B2 | 1/2015 | Kurs |
| 8,947,080 B2 | 2/2015 | Lukin et al. |
| 8,963,488 B2 | 2/2015 | Campanella et al. |
| 9,103,873 B1 | 8/2015 | Martens et al. |
| 9,157,859 B2 | 10/2015 | Walsworth et al. |
| 9,245,551 B2 | 1/2016 | El Hallak et al. |
| 9,249,526 B2 | 2/2016 | Twitchen et al. |
| 9,270,387 B2 | 2/2016 | Wolfe et al. |
| 9,291,508 B1 | 3/2016 | Biedermann et al. |
| 9,317,811 B2 | 4/2016 | Scarsbrook |
| 9,369,182 B2 | 6/2016 | Kurs et al. |
| 9,442,205 B2 | 9/2016 | Geiser et al. |
| 9,541,610 B2 | 1/2017 | Kaup et al. |
| 9,551,763 B1 | 1/2017 | Hahn et al. |
| 9,557,391 B2 | 1/2017 | Egan et al. |
| 9,570,793 B2 | 2/2017 | Borodulin |
| 9,590,601 B2 | 3/2017 | Krause et al. |
| 9,614,589 B1 | 4/2017 | Russo et al. |
| 9,632,045 B2 | 4/2017 | Englund et al. |
| 9,645,223 B2 | 5/2017 | Megdal et al. |
| 9,680,338 B2 | 6/2017 | Malpas et al. |
| 9,689,679 B2 | 6/2017 | Budker et al. |
| 9,720,055 B1 | 8/2017 | Hahn et al. |
| 9,778,329 B2 | 10/2017 | Heidmann |
| 9,779,769 B2 | 10/2017 | Heidmann |
| 9,891,297 B2 | 2/2018 | Sushkov et al. |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0094942 A1 | 5/2003 | Friend et al. |
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |
| 2004/0081033 A1 | 4/2004 | Arieli et al. |
| 2004/0095133 A1 | 5/2004 | Nikitin et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Frederick Du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |
| 2005/0130601 A1 | 6/2005 | Palermo et al. |
| 2005/0134257 A1 | 6/2005 | Etherington et al. |
| 2005/0138330 A1 | 6/2005 | Owens et al. |
| 2005/0146327 A1 | 7/2005 | Jakab |
| 2006/0012385 A1 | 1/2006 | Tsao et al. |
| 2006/0054789 A1 | 3/2006 | Miyamoto et al. |
| 2006/0055584 A1 | 3/2006 | Waite et al. |
| 2006/0062084 A1 | 3/2006 | Drew |
| 2006/0071709 A1 | 4/2006 | Maloberti et al. |
| 2006/0245078 A1 | 11/2006 | Kawamura |
| 2006/0247847 A1 | 11/2006 | Carter et al. |
| 2006/0255801 A1 | 11/2006 | Ikeda |
| 2006/0291771 A1 | 12/2006 | Braunisch et al. |
| 2007/0004371 A1 | 1/2007 | Okanobu |
| 2007/0120563 A1 | 5/2007 | Kawabata et al. |
| 2007/0247147 A1 | 10/2007 | Xiang et al. |
| 2007/0273877 A1 | 11/2007 | Kawano et al. |
| 2008/0016677 A1 | 1/2008 | Creighton, IV |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0253264 A1 | 10/2008 | Nagatomi et al. |
| 2008/0266050 A1 | 10/2008 | Crouse et al. |
| 2008/0279047 A1 | 11/2008 | An et al. |
| 2008/0299904 A1 | 12/2008 | Yi et al. |
| 2009/0001979 A1 | 1/2009 | Kawabata |
| 2009/0015262 A1 | 1/2009 | Strack et al. |
| 2009/0042592 A1 | 2/2009 | Cho et al. |
| 2009/0058697 A1 | 3/2009 | Aas et al. |
| 2009/0060790 A1 | 3/2009 | Okaguchi et al. |
| 2009/0079417 A1 | 3/2009 | Mort et al. |
| 2009/0079426 A1 | 3/2009 | Anderson |
| 2009/0132100 A1 | 5/2009 | Shibata |
| 2009/0157331 A1 | 6/2009 | Van Netten |
| 2009/0161264 A1 | 6/2009 | Meyersweissflog |
| 2009/0195244 A1 | 8/2009 | Mouget et al. |
| 2009/0222208 A1 | 9/2009 | Speck |
| 2009/0244857 A1 | 10/2009 | Tanaka |
| 2009/0277702 A1 | 11/2009 | Kanada et al. |
| 2009/0310650 A1 | 12/2009 | Chester et al. |
| 2010/0004802 A1 | 1/2010 | Bodin et al. |
| 2010/0015438 A1 | 1/2010 | Williams et al. |
| 2010/0015918 A1 | 1/2010 | Liu et al. |
| 2010/0045269 A1 | 2/2010 | Lafranchise et al. |
| 2010/0071904 A1 | 3/2010 | Burns et al. |
| 2010/0102809 A1 | 4/2010 | May |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0237149 A1 | 9/2010 | Olmstead |
| 2010/0271016 A1 | 10/2010 | Barclay et al. |
| 2010/0277121 A1 | 11/2010 | Hall et al. |
| 2010/0308813 A1 | 12/2010 | Lukin et al. |
| 2010/0315079 A1* | 12/2010 | Lukin .................. G01R 33/032 324/244.1 |
| 2010/0321117 A1 | 12/2010 | Gan |
| 2010/0326042 A1 | 12/2010 | McLean et al. |
| 2011/0031969 A1 | 2/2011 | Kitching et al. |
| 2011/0034393 A1 | 2/2011 | Justen et al. |
| 2011/0059704 A1 | 3/2011 | Norimatsu et al. |
| 2011/0062957 A1 | 3/2011 | Fu et al. |
| 2011/0062967 A1 | 3/2011 | Mohaupt |
| 2011/0066379 A1 | 3/2011 | Mes |
| 2011/0120890 A1 | 5/2011 | MacPherson et al. |
| 2011/0127999 A1 | 6/2011 | Lott et al. |
| 2011/0165862 A1 | 7/2011 | Yu et al. |
| 2011/0176563 A1 | 7/2011 | Friel et al. |
| 2011/0243267 A1 | 10/2011 | Won et al. |
| 2011/0270078 A1 | 11/2011 | Wagenaar et al. |
| 2011/0315988 A1 | 12/2011 | Yu et al. |
| 2012/0016538 A1 | 1/2012 | Waite et al. |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0089299 A1 | 4/2012 | Breed |
| 2012/0140219 A1 | 6/2012 | Cleary |
| 2012/0181020 A1 | 7/2012 | Barron et al. |
| 2012/0194068 A1 | 8/2012 | Cheng et al. |
| 2012/0203086 A1 | 8/2012 | Rorabaugh et al. |
| 2012/0232838 A1 | 9/2012 | Kemppi et al. |
| 2012/0235633 A1 | 9/2012 | Kesler et al. |
| 2012/0235634 A1 | 9/2012 | Hall et al. |
| 2012/0245885 A1 | 9/2012 | Kimishima |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0043863 A1 | 2/2013 | Ausserlechner et al. |
| 2013/0070252 A1 | 3/2013 | Feth |
| 2013/0093424 A1 | 4/2013 | Blank et al. |
| 2013/0107253 A1 | 5/2013 | Santori |
| 2013/0127518 A1 | 5/2013 | Nakao |
| 2013/0179074 A1 | 7/2013 | Haverinen |
| 2013/0215712 A1 | 8/2013 | Geiser et al. |
| 2013/0223805 A1 | 8/2013 | Ouyang et al. |
| 2013/0265042 A1 | 10/2013 | Kawabata et al. |
| 2013/0265782 A1 | 10/2013 | Barrena et al. |
| 2013/0270991 A1 | 10/2013 | Twitchen et al. |
| 2013/0279319 A1 | 10/2013 | Matozaki et al. |
| 2013/0292472 A1 | 11/2013 | Guha |
| 2014/0012505 A1 | 1/2014 | Smith et al. |
| 2014/0015522 A1 | 1/2014 | Widmer et al. |

(56) References Cited

U.S. PATENT DOCUMENTS

| | | |
|---|---|---|
| 2014/0037932 A1 | 2/2014 | Twitchen et al. |
| 2014/0044208 A1 | 2/2014 | Woodsum |
| 2014/0061510 A1 | 3/2014 | Twitchen et al. |
| 2014/0070622 A1 | 3/2014 | Keeling et al. |
| 2014/0072008 A1 | 3/2014 | Faraon et al. |
| 2014/0077231 A1 | 3/2014 | Twitchen et al. |
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0154792 A1 | 6/2014 | Moynihan et al. |
| 2014/0159652 A1 | 6/2014 | Hall et al. |
| 2014/0166904 A1 | 6/2014 | Walsworth et al. |
| 2014/0167759 A1 | 6/2014 | Pines et al. |
| 2014/0168174 A1 | 6/2014 | Idzik et al. |
| 2014/0180627 A1 | 6/2014 | Naguib et al. |
| 2014/0191139 A1 | 7/2014 | Englund |
| 2014/0191752 A1 | 7/2014 | Walsworth et al. |
| 2014/0197831 A1 | 7/2014 | Walsworth |
| 2014/0198463 A1 | 7/2014 | Klein |
| 2014/0210473 A1 | 7/2014 | Campbell et al. |
| 2014/0215985 A1 | 8/2014 | Pollklas |
| 2014/0225606 A1 | 8/2014 | Endo et al. |
| 2014/0247094 A1 | 9/2014 | Englund et al. |
| 2014/0264723 A1 | 9/2014 | Liang et al. |
| 2014/0265555 A1 | 9/2014 | Hall et al. |
| 2014/0272119 A1 | 9/2014 | Kushalappa et al. |
| 2014/0273826 A1 | 9/2014 | Want et al. |
| 2014/0291490 A1 | 10/2014 | Hanson et al. |
| 2014/0297067 A1 | 10/2014 | Malay |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0015247 A1 | 1/2015 | Goodwill et al. |
| 2015/0018018 A1 | 1/2015 | Shen et al. |
| 2015/0022404 A1 | 1/2015 | Chen et al. |
| 2015/0048822 A1 | 2/2015 | Walsworth et al. |
| 2015/0054355 A1 | 2/2015 | Ben-Shalom et al. |
| 2015/0061590 A1 | 3/2015 | Widmer et al. |
| 2015/0061670 A1 | 3/2015 | Fordham et al. |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0153151 A1 | 6/2015 | Kochanski |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |
| 2015/0268373 A1 | 9/2015 | Meyer |
| 2015/0269957 A1 | 9/2015 | El Hallak et al. |
| 2015/0276897 A1 | 10/2015 | Leussler et al. |
| 2015/0288352 A1 | 10/2015 | Krause et al. |
| 2015/0299894 A1 | 10/2015 | Markham et al. |
| 2015/0303333 A1 | 10/2015 | Yu et al. |
| 2015/0314870 A1* | 11/2015 | Davies .................. G05D 1/102 701/3 |
| 2015/0326030 A1 | 11/2015 | Malpas et al. |
| 2015/0326410 A1 | 11/2015 | Krause et al. |
| 2015/0354985 A1 | 12/2015 | Judkins et al. |
| 2015/0358026 A1 | 12/2015 | Gan |
| 2015/0374250 A1 | 12/2015 | Hatano et al. |
| 2015/0377865 A1 | 12/2015 | Acosta et al. |
| 2015/0377987 A1 | 12/2015 | Menon et al. |
| 2016/0018269 A1 | 1/2016 | Maurer et al. |
| 2016/0031339 A1 | 2/2016 | Geo |
| 2016/0036529 A1 | 2/2016 | Griffith et al. |
| 2016/0052789 A1 | 2/2016 | Gaathon et al. |
| 2016/0054402 A1 | 2/2016 | Meriles |
| 2016/0061914 A1 | 3/2016 | Jelezko |
| 2016/0071532 A9 | 3/2016 | Heidmann |
| 2016/0077167 A1 | 3/2016 | Heidmann |
| 2016/0097702 A1 | 4/2016 | Zhao et al. |
| 2016/0113507 A1 | 4/2016 | Reza et al. |
| 2016/0131723 A1 | 5/2016 | Nagasaka |
| 2016/0139048 A1 | 5/2016 | Heidmann |
| 2016/0146904 A1 | 5/2016 | Stetson, Jr. et al. |
| 2016/0161429 A1 | 6/2016 | Englund et al. |
| 2016/0161583 A1 | 6/2016 | Meriles et al. |
| 2016/0174867 A1 | 6/2016 | Hatano |
| 2016/0214714 A1 | 7/2016 | Sekelsky |
| 2016/0216304 A1 | 7/2016 | Sekelsky |
| 2016/0216340 A1 | 7/2016 | Egan et al. |
| 2016/0216341 A1 | 7/2016 | Boesch et al. |
| 2016/0221441 A1 | 8/2016 | Hall et al. |
| 2016/0223621 A1 | 8/2016 | Kaup et al. |
| 2016/0231394 A1 | 8/2016 | Manickam et al. |
| 2016/0266220 A1 | 9/2016 | Sushkov et al. |
| 2016/0282427 A1 | 9/2016 | Heidmann |
| 2016/0291191 A1 | 10/2016 | Fukushima et al. |
| 2016/0313408 A1 | 10/2016 | Hatano et al. |
| 2016/0348277 A1 | 12/2016 | Markham et al. |
| 2016/0356863 A1 | 12/2016 | Boesch et al. |
| 2017/0010214 A1 | 1/2017 | Osawa et al. |
| 2017/0010334 A1 | 1/2017 | Krause et al. |
| 2017/0010338 A1 | 1/2017 | Bayat et al. |
| 2017/0010594 A1 | 1/2017 | Kottapalli et al. |
| 2017/0023487 A1 | 1/2017 | Boesch |
| 2017/0030982 A1 | 2/2017 | Jeske et al. |
| 2017/0038314 A1 | 2/2017 | Suyama et al. |
| 2017/0038411 A1 | 2/2017 | Yacobi et al. |
| 2017/0068012 A1 | 3/2017 | Fisk |
| 2017/0074660 A1 | 3/2017 | Gann et al. |
| 2017/0075020 A1* | 3/2017 | Gann .................. G01V 3/16 |
| 2017/0075205 A1 | 3/2017 | Kriman et al. |
| 2017/0077665 A1 | 3/2017 | Liu et al. |
| 2017/0104426 A1 | 4/2017 | Mills |
| 2017/0138735 A1 | 5/2017 | Cappellaro et al. |
| 2017/0139017 A1 | 5/2017 | Egan et al. |
| 2017/0146615 A1 | 5/2017 | Wolf et al. |
| 2017/0199156 A1 | 7/2017 | Villani et al. |
| 2017/0205526 A1 | 7/2017 | Meyer |
| 2017/0207823 A1 | 7/2017 | Russo et al. |
| 2017/0211947 A1 | 7/2017 | Fisk |
| 2017/0212046 A1 | 7/2017 | Cammerata |
| 2017/0212177 A1 | 7/2017 | Coar et al. |
| 2017/0212178 A1 | 7/2017 | Hahn et al. |
| 2017/0212179 A1 | 7/2017 | Hahn et al. |
| 2017/0212180 A1 | 7/2017 | Hahn et al. |
| 2017/0212181 A1 | 7/2017 | Coar et al. |
| 2017/0212182 A1 | 7/2017 | Hahn et al. |
| 2017/0212183 A1 | 7/2017 | Egan et al. |
| 2017/0212184 A1 | 7/2017 | Coar et al. |
| 2017/0212185 A1 | 7/2017 | Hahn et al. |
| 2017/0212186 A1 | 7/2017 | Hahn et al. |
| 2017/0212187 A1 | 7/2017 | Hahn et al. |
| 2017/0212190 A1 | 7/2017 | Reynolds et al. |
| 2017/0212258 A1 | 7/2017 | Fisk |
| 2017/0343617 A1 | 11/2017 | Manickam et al. |
| 2017/0343619 A1 | 11/2017 | Manickam et al. |
| 2017/0343621 A1 | 11/2017 | Hahn et al. |
| 2018/0136291 A1 | 5/2018 | Pham et al. |
| 2018/0275209 A1 | 9/2018 | Mandeville et al. |
| 2018/0275212 A1 | 9/2018 | Hahn et al. |

FOREIGN PATENT DOCUMENTS

| | | |
|---|---|---|
| DE | 69608006 T2 | 2/2001 |
| DE | 19600241 C2 | 8/2002 |
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |

(56) References Cited

FOREIGN PATENT DOCUMENTS

| | | |
|---|---|---|
| EP | 2 707 523 | 3/2014 |
| EP | 2 745 360 | 6/2014 |
| EP | 2 769 417 | 8/2014 |
| EP | 2 790 031 | 10/2014 |
| EP | 2 837 930 A1 | 2/2015 |
| EP | 2 907 792 | 8/2015 |
| GB | 2 423 366 A | 8/2006 |
| GB | 2 433 737 | 7/2007 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2009/073736 | 6/2009 |
| WO | WO-2011/046403 A2 | 4/2011 |
| WO | WO-2011/153339 A1 | 12/2011 |
| WO | WO-2012/016977 A2 | 2/2012 |
| WO | WO-2012/084750 | 6/2012 |
| WO | WO-2013/027074 | 2/2013 |
| WO | WO-2013/059404 A1 | 4/2013 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/142945 | 9/2015 |
| WO | WO-2015/157110 A1 | 10/2015 |
| WO | WO-2015/157290 A1 | 10/2015 |
| WO | WO-2015/158383 A1 | 10/2015 |
| WO | WO-2015/193156 A1 | 12/2015 |
| WO | WO-2016/075226 A1 | 5/2016 |
| WO | WO-2016/118756 A1 | 7/2016 |
| WO | WO-2016/118791 A1 | 7/2016 |
| WO | WO-2016/122965 A1 | 8/2016 |
| WO | WO-2016/122966 A1 | 8/2016 |
| WO | WO-2016/126435 A1 | 8/2016 |
| WO | WO-2016/126436 A1 | 8/2016 |
| WO | WO-2016/190909 A2 | 12/2016 |
| WO | WO-2017/007513 A1 | 1/2017 |
| WO | WO-2017/007514 A1 | 1/2017 |
| WO | WO-2017/014807 A1 | 1/2017 |
| WO | WO-2017/039747 A1 | 3/2017 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |
| WO | WO-2017/127097 A1 | 7/2017 |
| WO | WO-2017/127098 A1 | 7/2017 |

OTHER PUBLICATIONS

Chadebec et al., "Rotor fault detection of electrical machines by low frequency magnetic stray field analysis," 2005 5th IEEE International Symposium on Diagnostics for Electric Machines, Power Electronics and Drives, Vienna, 2005, submitted Mar. 22, 2006, pp. 1-6.

Froidurot et al., "Magnetic discretion of naval propulsion machines," in IEEE Transactions on Magnetics, vol. 38, No. 2, pp. 1185-1188, Mar. 2002.

IEEE Std 802.11 TM-2012 Wireless LAN Medium Access Control (MAC) and Physical Layer (PHY) Specifications, 1 page.

Kwon et al., "Analysis of the far field of permanent-magnet motors and effects of geometric asymmetries and unbalance in magnet design," in IEEE Transactions on Magnetics, vol. 40, No. 2, pp. 435-442, Mar. 2004.

Maertz et al., "Vector magnetic field microscopy using nitrogen vacancy centers in diamond", Applied Physics Letters 96, No. 9, Mar. 1, 2010, pp. 092504-1-092504-3.

U.S. Notice of Allowance dated Feb. 2, 2018, from related U.S. Appl. No. 15/003,292, 8 pages.

U.S. Notice of Allowance dated Feb. 21, 2018, from related U.S. Appl. No. 15/003,176, 9 pages.

U.S. Office Action dated Feb. 1, 2018, from related U.S. Appl. No. 15/003,577, 16 pages.

U.S. Office Action dated Feb. 5, 2018, from related U.S. Appl. No. 15/450,504, 12 pages.

U.S. Office Action dated Jan. 25, 2018, from related U.S. Appl. No. 15/672,953, 28 pages.

U.S. Office Action dated Jan. 26, 2018, from related U.S. Appl. No. 15/003,678, 14 pages.

U.S. Office Action dated Mar. 27, 2018, from related U.S. Appl. No. 15/468,386, 21 pages.

U.S. Office Action dated Mar. 28, 2018, from related U.S. Appl. No. 15/003,177, 12 pages.

U.S. Office Action dated Mar. 5, 2018, from related U.S. Appl. No. 14/866,730, 14 pages.

U.S. Office Action dated Mar. 8, 2018, from related U.S. Appl. No. 15/380,691, 12 pages.

U.S. Office Action dated Mar. 8, 2018, from related U.S. Appl. No. 15/479,256, 30 pages.

Wegerich, "Similarity based modeling of time synchronous averaged vibration signals for machinery health monitoring," 2004 IEEE Aerospace Conference Proceedings (IEEE Cat. No. 04TH8720), 2004, pp. 3654-3662 vol. 6.

Wikipedia, "Continuous phase modulation", downloaded from https://web.archive.org/web/20151017015236/https://en.wikipedia.org/wiki/Continuous_phase_modulation on May 10, 2017, 3 pages.

Wikipedia, "Minimum-shift keying", downloaded from https://web.archive.org/web/20151017175828/https://en.wikipedia.org/wiki/Minimum-shift_keying on May 10, 2017, 2 pages.

"'Diamond Sensors, Detectors, and Quantum Devices' in Patent Application Approval Process," Chemicals & Chemistry, pp. 1-6, (Feb. 28, 2014), 6 pages.

"Findings from University of Stuttgart in physics reported," Science Letter, (Jul. 7, 2009), 2 pages.

(56) References Cited

OTHER PUBLICATIONS

"New Findings on Nitrogen from Ecole Normale Superieure Summarized (Magnetic imaging with an ensemble of nitrogen vacancy-centers in diamond)," Physics Week, pp. 1-2, (Jul. 21, 2015), 2 pages.
"Patent Issued for Diamond Sensors, Detectors, and Quantum Devices (U.S. Pat. No. 9,249,526)," Journal of Engineering, pp. 1-5 (Feb. 15, 2016), 5 pages.
"Researchers Submit Patent Application, 'Diamond Sensors, Detectors, and Quantum Devices', for Approval," Chemicals & Chemistry, pp. 1-7, (Apr. 11, 2014), 7 pages.
Acosta et al., "Broadband magnetometry by infrared-absorption detection of nitrogen-vacancy ensembles in diamond," Appl. Phys. Letters 97: 174104 (Oct. 29, 2010), 4 pages.
Acosta et al., "Diamonds with a high density of nitrogen-vacancy centers for magnetometry applications," Physical Review B 80(115202): 1-15 (Sep. 9, 2009), 15 pages.
Acosta et al., "Nitrogen-vacancy centers: physics and applications," MRS Bulletin 38(2): 127-130 (Feb. 2013), 4 pages.
Acosta, "Optical Magnetometry with Nitrogen-Vacancy Centers in Diamond," University of California Berkeley, (Spring 2011), 118 pages.
Aiello et al., "Composite-pulse magnetometry with a solid-state quantum sensor," Nature Communications 4(1419): 1-6 (Jan. 29, 2013), 6 pages.
Alam, "Solid-state 13C magic angle spinning NMR spectroscopy characterization of particle size structural variations in synthetic nanodiamonds," Materials Chemistry and Physics 85(2-3): 310-315 (Jun. 15, 2004), 6 pages.
Albrecht et al., "Coupling of nitrogen vacancy centres in nanodiamonds by means of phonons," New Journal of Physics 15(083014): 1-26 (Aug. 6, 2013), 27 pages.
Appel et al., "Nanoscale microwave imaging with a single electron spin in diamond," New Journal of Physics 17(112001): 1-6 (Nov. 3, 2015), 7 pages.
Arai et al., "Fourier magnetic imaging with nanoscale resolution and compressed sensing speed-up using electronic spins in diamond," Nature Nanotechnology 10: 859-864 (Aug. 10, 2015), 7 pages.
Aslam et al., "Single spin optically detected magnetic resonance with 60-90 GHz (E-band) microwave resonators," Review of Scientific Instruments 86(064704): 1-8 (Jun. 22, 2015), 9 pages.
Awschalom et al., "Diamond age of spintronics," Scientific American 297: 84-91 (Oct. 2007), 8 pages.
Babamoradi et al., "Correlation between entanglement and spin density in nitrogen-vacancy center of diamond," European Physical Journal D 65: 597-603 (Dec. 1, 2011), 7 pages.
Babunts et al., "Diagnostics of NV defect structure orientation in diamond using optically detected magnetic resonance with a modulated magnetic field," Technical Physics Letters 41(6): 583-586 (Jun. 2015; first published online Jul. 14, 2015), 4 pages.
Babunts et al., "Temperature-scanned magnetic resonance and the evidence of two-way transfer of a nitrogen nuclear spin hyperfine interaction in coupled NV-N pairs in diamond," JETP Letters 95(8): 429-432 (Jun. 27, 2012), 4 pages.
Bagguley et al., "Zeeman effect of acceptor states in semiconducting diamond," Journal of the Physical Society of Japan 21(Supplement): 244-248 (1966), 7 pages.
Balasubramanian et al., "Nanoscale imaging magnetometry with diamond spins under ambient conditions," Nature 455: 648-651 (Oct. 2, 2008), 5 pages.
Balmer et al., "Chemical Vapour deposition synthetic diamond: materials technology and applications," J. of Physics: Condensed Matter 21(36): 1-51 (Aug. 19, 2009), 51 pages.
Baranov et al., "Enormously High Concentrations of Fluorescent Nitrogen-Vacancy Centers Fabricated by Sintering of Detonation Nanodiamonds," Small 7(11): 1533-1537 (Jun. 6, 2011; first published online Apr. 26, 2011), 5 pages.
Barfuss et al., "Strong mechanical driving of a single electron spin," Nature Physics 11: 820-824 (Aug. 3, 2015), 6 pages.

Barry et al., "Optical magnetic detection of single-neuron action potentials using quantum defects in diamond," as submitted to Quantum Physics on Feb. 2, 2016, 23 pages.
Bennett et al., "CVD Diamond for High Power Laser Applications," SPIE 8603, High-Power Laser Materials Processing: Lasers, Beam Delivery, Diagnostics, and Applications II, 860307 (Feb. 22, 2013), 10 pages.
Berman & Chernobrod, "Single-spin microscope with sub-nanoscale resolution based on optically detected magnetic resonance," SPIE 7608, Quantum Sensing and Nanophotonic Devices VII, 76080Y (Jan. 23, 2010), 4 pages.
Berman et al. "Measurement of single electron and nuclear spin states based on optically detected magnetic resonance," J. Physics: Conf. Series 38: 167-170 (2006), 5 pages.
Blakley et al., "Room-temperature magnetic gradiometry with fiber-coupled nitrogen-vacancy centers in diamond," Optics Letters 40(16): 3727-3730 (Aug. 5, 2015), 4 pages.
Bourgeois, et al., "Photoelectric detection of electron spin resonance of nitrogen-vacancy centres in diamond," Nature Communications 6(8577): 1-8 (Oct. 21, 2015), 8 pages.
Brenneis, et al. "Ultrafast electronic readout of diamond nitrogen-vacancy centres coupled to graphene." Nature nanotechnology 10.2 (2015): 135-139.
Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.
Budker & Kimball, "Optical Magnetometry," Cambridge Press, (2013), 11 pages.
Budker & Romalis, "Optical Magnetometry," Nature Physics 3: 227-243 (Apr. 2007), 8 pages.
Casanova, et al., "Effect of magnetic field on phosphorus centre in diamond," Physica Status Solidi A 186(2): 291-295 (Jul. 30, 2001), 6 pages.
Castelletto, et al., "Frontiers in diffraction unlimited optical methods for spin manipulation, magnetic field sensing and imaging using diamond nitrogen vacancy defects," Nanophotonics 1(2): 139-153 (Nov. 2012), 15 pages.
Chapman, et al., "Anomalous saturation effects due to optical spin depolarization in nitrogen-vacancy centers in diamond nanocrystals," Physical Review B 86(045204): 1-8 (Jul. 10, 2012), 8 pages.
Chavez, et al. "Detecting Arctic oil spills with NMR: a feasibility study." Near Surface Geophysics 13.4 (Feb. 2015): 409-416.
Chen et al., "Vector magnetic field sensing by a single nitrogen vacancy center in diamond," EPL 101(67003): 1-5 (Mar. 2013), 6 pages.
Chernobrod et al., "Improving the sensitivity of frequency modulation spectroscopy using nanomechanical cantilevers," Applied Physics Letters 85(17): 3896-3898 (Oct. 25, 2004), 3 pages.
Chernobrod et al., "Spin Microscope Based on Optically Detected Magnetic Resoncance," Journal of Applied Physics 97(014903): 1-3, (2005; first published online Dec. 10, 2004), 4 pages.
Childress et al., "Coherent dynamics of coupled electron and nuclear spin qubits in diamond," Science 314(5797): 281-285 (Oct. 13, 2006), 6 pages.
Chipaux et al., "Magnetic imaging with an ensemble of nitrogen vacancy-centers in diamond," European Physical Journal D 69(166): 1-10 (Jul. 2, 2015), 10 pages.
Chipaux et al., "Nitrogen vacancies (NV) centers in diamond for magnetic sensors and quantum sensing," SPIE 9370, Quantum Sensing and Nanophotonic Devices XII, 93701V (Feb. 8, 2015), 6 pages.
Chipaux, et al., "Wide bandwidth instantaneous radio frequency spectrum analyzer based on nitrogen vacancy centers in diamond," Applied Physics Letters 107(233502): 1-5 (2015), 6 pages.
Clevenson et al., "Broadband magnetometry and temperature sensing with a light-trapping diamond waveguide," Nature Physics 11: 393-397 (May 2015; first published online Apr. 6, 2015), 6 pages.
Constable, "Geomagnetic Spectrum, Temporal." In Encyclopedia of Geomagnetism and Paleomagnetism, pp. 353-355, Springer: Dordrecht, Netherlands (2007), 3 pages.

(56) References Cited

OTHER PUBLICATIONS

Cooper et al., "Time-resolved magnetic sensing with electronic spins in diamond," Nature Communications 5:3141: 1-7 (Jan. 24, 2014), 7 pages.
Creedon et al., "Strong coupling between P1 diamond impurity centers and a three-dimensional lumped photonic microwave cavity," Physical Review B 91(140408R): 1-5 (Apr. 24, 2015), 5 pages.
Dale, et al. "Medical applications of diamond magnetometry: commercial viability." arXiv preprint arXiv:1705.01994 (May 8, 2017), pp. 1-7.
Davies, "Current problems in diamond: towards a quantitative understanding," Physica B 273-274: 15-13 (Dec. 15, 1999), 9 pages.
De Lange et al., "Single-Spin Magnetometry with Multipulse Sensing Sequences," Physical Review Letters 106(080802): 1-4 (Feb. 24, 2011), 4 pages.
Degen, "Scanning magnetic field microscope with a diamond single-spin sensor," Applied Physics Letters 92(243111): 1-3 (Jun. 17, 2008), 3 pages.
Delacroix et al., "Design, manufacturing, and performance analysis of mid-infrared achromatic half-wave plates with diamond subwavelength gratings," Applied Optics 51(24): 5897-5902 (Aug. 16, 2012), 6 pages.
Denatale et al., "Fabrication and characterization of diamond moth eye antireflective surfaces on Ge," J. of Applied Physics 71: 1388-1393 (Mar. 1992), 8 pages.
Dobrovitski et al., "Quantum Control over Single Spins in Diamond," Annual Review of Condensed Matter Physics 4: 23-50 (Apr. 2013), 30 pages.
Doherty et al., "The nitrogen-vacancy colour centre in diamond," Physics Reports 528: 1-45 (Jul. 1, 2013), 45 pages.
Doherty et al., "Theory of the ground-state spin of the NV-center in diamond," Physical Review B 85(205203): 1-21 (May 3, 2012), 21 pages.
Doi et al., "Pure negatively charged state of the NV center in n-type diamond," Physical Review B 93(081203): 1-6 (Feb. 3, 2016), 6 pages.
Drake et al., "Influence of magnetic field alignment and defect concentration on nitrogen-vacancy polarization in diamond," New Journal of Physics 18(013011): 1-8 (Jan. 2016; first published on Dec. 24, 2015), 9 pages.
Dreau et al., "Avoiding power broadening in optically detected magnetic resonance of single NV defects for enhanced dc magnetic field sensitivity," Physical Review B 84(195204): 1-8 (Nov. 23, 2011), 8 pages.
Dreau et al., "High-resolution spectroscopy of single NV defects coupled with nearby 13C nuclear spins in diamond," Physical Review B 85(134107): 1-7 (Apr. 20, 2012), 7 pages.
Dumeige et al., "Magnetometry with nitrogen-vacancy ensembles in diamond based on infrared absorption in a doubly resonant optical cavity," Physical Review B 87(155202): 1-9 (Apr. 8, 2013), 9 pages.
Epstein et al., "Anisotropic interactions of a single spin and dark-spin spectroscopy in diamond," Nature Physics 1: 94-98 (Nov. 2005), 5 pages.
Fallah et al., "Multi-sensor approach in vessel magnetic wake imaging," Wave Motion 51(1): 60-76 (Jan. 2014), retrieved from http://www.sciencedirect.com/science/article/pii/S0165212513001133 (Aug. 21, 2016).
Fedotov et al., "High-resolution magnetic field imaging with a nitrogen-vacancy diamond sensor integrated with a photonic-crystal fiber," Optics Letters 41(3): 472-475 (Feb. 1, 2016; published Jan. 25, 2016), 4 pages.
Fedotov et al., "Photonic-crystal-fiber-coupled photoluminescence interrogation of nitrogen vacancies in diamond nanoparticles," Laser Physics Letters 9(2): 151-154 (Feb. 2012; first published online Dec. 2, 2011), 5 pages.
Feng & Wei, "A steady-state spectral method to fit microwave absorptions of NV centers in diamonds: application to sensitive magnetic field sensing," Measurement Science & Technology 25(105102): 1-6 (Oct. 2014; first published online Aug. 29, 2014), 7 pages.
Fologea, et al. "Detecting single stranded DNA with a solid state nanopore." Nano Letters 5.10 (Aug. 15, 2005): 1905-1909.
Freitas, et al., "Solid-State Nuclear Magnetic Resonance (NMR) Methods Applied to the Study of Carbon Materials," Chemistry and Physics of Carbon, vol. 31 (2012), 45 pages.
Gaebel, et al. "Room-temperature coherent coupling of single spins in diamond." Nature Physics 2.6 (May 28, 2006): 408-413.
GB Examination Report from United Kingdom application No. GB 1618202.4 dated Jan. 10, 2017.
Geiselmann et al., "Fast optical modulation of the fluorescence from a single nitrogen-vacancy centre," Nature Physics 9: 785-789 (Dec. 2013; first published online Oct. 13, 2013), 5 pages.
Gombert & Blasi, "The Moth-Eye Effect-From Fundamentals to Commercial Exploitation," Functional Properties of Bio-Inspired Surfaces: 79-102, (Nov. 2009), 26 pages.
Gong et al., "Generation of Nitrogen-Vacancy Center Pairs in Bulk Diamond by Molecular Nitrogen Implantation," Chinese Physics Letters 33(2)(026105): 1-4 (Feb. 2016), 5 pages.
Gould et al., "An imaging magnetometer for bio-sensing based on nitrogen-vacancy centers in diamond," SPIE 8933, Frontiers in Biological Detection: From Nanosensors to Systems VI, 89330L (Mar. 18, 2014), 8 pages.
Gould et al., "Room-temperature detection of a single 19 nm superparamagnetic nanoparticle with an imaging magnetometer," Applied Physics Letters 105(072406): 1-4 (Aug. 19, 2014), 5 pages.
Gruber et al., "Scanning confocal optical microscopy and magnetic resonance on single defect centers," Science 276(5321): 2012-2014 (Jun. 27, 1997), 4 pages.
Haeberle et al., "Nanoscale nuclear magnetic imaging with chemical contrast," Nature Nanotechnology 10: 125-128 (Feb. 2015; first published online Jan. 5, 2015), 4 pages.
Haihua et al., "Design of wideband anti-reflective sub wavelength nanostructures," Infrared and Laser Engineering 40(2): 267-270 (Feb. 2011), 4 pages.
Hall et al., "Sensing of Fluctuating Nanoscale Magnetic Fields Using Nitrogen-Vacancy Centers in Diamond," Physical Review Letters 103(220802): 1-4 (Nov. 25, 2009), 4 pages.
Hanson et al., "Coherent Dynamics of a Single Spin Interacting with an Adjustable Spin Bath," Science 320(5874): 352-355 (Apr. 18, 2008), 5 pages.
Hanson et al., "Polarization and Readout of Coupled Single Spins in Diamond," Physical Review Letters 97(087601): 1-4 (Aug. 23, 2006), 4 pages.
Hanson et al., "Room-temperature manipulation and decoherence of a single spin in diamond," Physical Review 74(161203): 1-4 (Oct. 26, 2006), 4 pages.
Hanzawa et al., "Zeeman effect on the zero-phonon line of the NV center in synthetic diamond," Physica B 184(1-4): 137-140 (Feb. 1993), 4 pages.
Heerema, et al. "Graphene nanodevices for DNA sequencing." Nature nanotechnology 11.2 (Feb. 3, 2016): 127-136.
Hegyi & Yablonovitch, "Molecular imaging by optically detected electron spin resonance of nitrogen-vacancies in nanodiamonds," Nano Letters 13(3): 1173-1178 (Mar. 2013; first published online Feb. 6, 2013), 6 pages.
Hegyi & Yablonovitch, "Nanodiamond molecular imaging with enhanced contrast and expanded field of view," Journal of Biomedical Optics 19(1)(011015): 1-8 (Jan. 2014), 9 pages.
Hilser et al., "All-optical control of the spin state in the NV-center in diamond," Physical Review B 86(125204): 1-8 (Sep. 14, 2012), 8 pages.
Hobbs, "Study of the Environmental and Optical Durability of AR Microstructures in Sapphire, ALON, and Diamond," SPIE 7302, Window and Dome Technologies and Materials XI, 73020J (Apr. 27, 2009), 14 pages.
Huebener et al., "ODMR of NV centers in nano-diamonds covered with N@C60," Physica Status Solidi B 245(10): 2013-2017 (Oct. 2008; first published online Sep. 8, 2008), 5 pages.
Huxter et al., "Vibrational and electronic dynamics of nitrogen-vacancy centres in diamond revealed by two-dimensional ultrafast spectroscopy," Nature Physics 9: 744-749 (Sep. 29, 2013), 6 pages.
International Search Report and Written Opinion from related PCT application PCT/US2017/035315 dated Aug. 24, 2017, 7 pages.

(56) References Cited

OTHER PUBLICATIONS

International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Apr. 4, 2017 from related PCT application PCT/US16/68366, 9 pages.
International Search Report and Written Opinion of the International Searching Authority dated Feb. 15, 2017 from related PCT application PCT/US2016/014390, 20 pages.
International Search Report and Written opinion of the International Searching Authority dated Jul. 12, 2016, from related PCT application PCT/US2016/014287, 14 pages.
International Search Report and Written Opinion of the International Searching Authority dated Jul. 16, 2015, from related PCT application PCT/US2015/24723, 8 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016, from related PCT application PCT/US2016/014363, 8 pages.
International Search Report and Written Opinion of the International Searching Authority dated Mar. 25, 2016, from related PCT application PCT/US2016/014389, 19 pages.
International Search Report and Written Opinion of the International Searching Authority dated Mar. 27, 2017 from related PCT application PCT/US16/68344, 16 pages.
International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016, from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016, from related PCT application PCT/US2016/014328, 7 pages.
International Search Report and Written Opinion of the International Searching Authority dated Mar. 29, 2016, from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017, from related PCT application PCT/US2017/021593, 10 pages.
International Search Report and Written Opinion of the International Searching Authority dated May 19, 2017, from related PCT application PCT/US17/18099, 16 pages.
International Search Report and Written Opinion of the International Searching Authority dated May 26, 2016, from related PCT application PCT/US2016/014331, 15 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
International Search Report and Written Opinion of the International Searching Authority dated Sep. 13, 2016, from related PCT application PCT/US16/14377, 11 pages.
International Search Report and Written Opinion of the International Searching Authority dated Jul. 14, 2017, from related PCT application PCT/US2017/022118, 13 pages.

(56) References Cited

OTHER PUBLICATIONS

International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
International Search Report and Written Opinion of the International Searching Authority dated Jun. 15, 2017, from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169, 11 pages.
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168, 7 pages.
International Search Report and Written Opinion of the International Searching Authority dated Jun. 6, 2017, from related PCT application PCT/2017/024165, 9 pages.
International Search Report and Written Opinion of the International Searching Authority dated Jun. 6, 2017, from related PCT application PCT/US2017/024172, 9 pages.
Ivady et al., "Pressure and temperature dependence of the zero-field splitting in the ground state of NV centers in diamond: A first-principles study," Physical Review B 90(235205): 1-8 (Dec. 2014), 8 pages.
Jarmola et al., "Temperature- and Magnetic-Field-Dependent Longitudinal Spin Relaxation in Nitrogen-Vacancy Ensembles in Diamond," Physical Review Letters 108 (197601): 1-5 (May 2012), 5 pages.
Jensen et al., "Light narrowing of magnetic resonances in ensembles of nitrogen-vacancy centers in diamond," Physical Review B 87(014115): 1-10 (Jan. 2013), 10 pages.
Kailath, "Linear Systems," Prentice Hall, (1979), 6 pages.
Karlsson et al., "Diamond micro-optics: microlenses and antireflection structures surfaces for the infrared spectral region," Optics Express 11(5): 502-507 (Mar. 10, 2003), 6 pages.
Keyser "Enhancing nanopore sensing with DNA nanotechnology." Nature nanotechnology 11.2 (Feb. 2016): 106-108.
Khan & Hemmer, "Noise limitation in nano-scale imaging," Proceedings of SPIE vol. 5842: 302-305, (Dec. 2005), 7 pages.
Kim et al., "Electron spin resonance shift and linewidth broadening of nitrogen-vacancy centers in diamond as a function of electron irradiation dose," Applied Physics Letters 101(082410): 1-5 (Aug. 2012), 6 pages.
Kim et al., "Jahn-Teller Splitting and Zeeman Effect of Acceptors in Diamond," Physica B 273-274: 647-627 (Jul. 1999), 4 pages.
Kim et al., "Magnetospectroscopy of acceptors in 'blue' diamonds," Physica B 302-301: 88-100 (Aug. 2001), 13 pages.
Kim et al., "Zeeman effect of electronic Raman lines of accepters in elemental semiconductors: Boron in blue diamond," Physical Review B 62(12): 8038-8052 (Sep. 2000), 15 pages.
King et al., "Optical polarization of 13C nuclei in diamond through nitrogen vacancy centers," Physical Review B 81(073201): 1-4 (Feb. 2010), 4 pages.
Kok et al., "Materials Science: Qubits in the pink," Nature 444(2): 49 (Nov. 2006), 1 page.

Konenko et al., "Formation of antireflective surface structures on diamond films by laser patterning," Applied Physics A 68:99-102 (Jan. 1999), 4 pages.
Kraus et al., "Magnetic field and temperature sensing with atomic-scale spin defects in silicon carbide," Scientific Reports 4(5303): 1-8 (Jul. 2014), 8 pages.
Lai et al., "Influence of a static magnetic field on the photoluminescence of an ensemble of nitrogen vacancy color centers in a diamond single-crystal," Applied Physics Letters 95, (Sep. 2009), 4 pages.
Lai et al., "Optically detected magnetic resonance of a single Nitrogen-Vacancy electronic spin in diamond nanocrystals," CLEO/EQEC, (Jun. 14-19, 2009), 1 page.
Laraoui et al., "Nitrogen-vacancy assisted magnetometry of paramagnetic centers in an individual diamond nanocrystal," Nano Letters 12: 3477-3482 (Jul. 2012), 6 pages.
Lazariev et al., "A nitrogen-vacancy spin based molecular structure microscope using multiplexed projection reconstruction," Scientific Reports 5(14130): 1-8 (Sep. 2015), 8 pages.
Le Sage et al., "Efficient photon detection from color centers in a diamond optical waveguide," Phys. Rev. B 85: 121202(R), pp. 121202-1-121202-4, (Mar. 23, 2012), 4 pages.
Lee et al., "Vector magnetometry based on S=3/2 electronic spins," Physical Review B 92 (115201): 1-7 (Sep. 2015), 7 pages.
Lesik et al., "Preferential orientation of NV defects in CVD diamond films grown on (113)-oriented substrates," Diamond and Related Materials 56: 47-53 (Jun. 2015), 7 pages.
Levchenko et al., "Inhomogeneous broadening of optically detected magnetic resonance of the ensembles of nitrogen-vacancy centers in diamond by interstitial carbon atoms," Applied Physics Letters 106, (Mar. 2015; published online Mar. 9, 2015), 6 pages.
Lindsay "The promises and challenges of solid-state sequencing." Nature nanotechnology 11.2 (Feb. 2016): 109-111.
Liu et al., "Electron spin studies of nitrogen vacancy centers in nanodiamonds," Acta Physica Sinica 62(16) 164208: 1-5 (Aug. 2013), 5 pages.
Liu et al., "Fiber-integrated diamond-based magnetometer," Applied Physics Letters 103(143105): 1-4 (Sep. 2013), 5 pages.
MacLaurin et al., "Nanoscale magnetometry through quantum control of nitrogen-vacancy centres in rotationally diffusing nanodiamonds," New Journal of Physics 15, (Jan. 2013), 16 pages.
MacQuarie et al., "Mechanical spin control of nitrogen-vacancy centers in diamond," Retrieved from http://www.arxiv.org/pdf/1306.6356.pdf, pp. 1-8, (Jun. 2013), 8 pages.
Macs et al., "Diamond as a magnetic field calibration probe," Journal of Physics D: Applied Physics 37, (Apr. 2004; published Mar. 17, 2004), 6 pages.
Maletinsky et al., "A robust scanning diamond sensor for nanoscale imaging with single nitrogen-vacancy centres," Nature Nanotechnology 7: 320-324, (May 2012; published Apr. 15, 2012), 5 pages.
Mamin et al., "Multipulse Double-Quantum Magnetometry with Near-Surface Nitrogen-Vacancy Centers," Physical Review Letters 13(030803): 1-5 (Jul. 2014), 5 pages.
Mamin et al., "Nanoscale Nuclear Magnetic Resonance with a Nitrogen-Vacancy Spin Sensor," Science 339, (Feb. 2013), 5 pages.
Manson et al., "GR transitions in diamond: magnetic field measurements," Journal of Physics C Solid St. Phys 13: L1005-L1009, (Nov. 1980), 6 pages.
Massachusetts Institute of Technology, "Wide-Field Imaging Using Nitrogen Vacancies," in Patent Application Approval Process, Physics Week: 1-5, (Jan. 20, 2015), 5 pages.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Matsuda et al., "Development of a plastic diamond anvil cell for high pressure magneto-photoluminescence in pulsed high magnetic fields," International Journal of Modern Physics B 18(2729), (Nov. 2004), 7 pages.

(56) References Cited

OTHER PUBLICATIONS

Maze et al., "Nanoscale magnetic sensing using spin qubits in diamond," Proc. SPIE 7225, Advanced Optical Concepts in Quantum Computing, Memory, and Communication II, 722509 (Feb. 2, 2009) 8 pages.

Maze et al., "Nanoscale magnetic sensing with an individual electronic spin in diamond," Nature Physics 455: 644-647 (Oct. 2, 2008), 5 pages.

Meijer et al., "Generation of single color centers by focused nitrogen implantation," Applied Physics Letters 87(261909): 1-3 (Dec. 2005), 4 pages.

Michaelovich et al., "Polarization Dependencies of the Nitrogen-Vacancy Center." Undergraduate Project Report, Ben-Gurion University, Aug. 2015, pp. 1-9.

Millot et al., "High-field Zeeman and Paschen-Back effects at high pressure in oriented ruby," Physical Review B 78 (155125): 1-7 (Oct. 2008), 7 pages.

Moessle, et al. "SQUID-detected magnetic resonance imaging in microtesla fields." Annu. Rev. Biomed. Eng. 9 (May 23, 2008): 389-413.

Moriyama et al., "Importance of electron-electron interactions and Zeeman splitting in single-wall carbon nanotube quantum dots," Physica E 26: 473-476 (Feb. 2005), 4 pages.

Mrozek et al., "Circularly polarized microwaves for magnetic resonance study in the GHz range: Application to nitrogen-vacancy in diamonds," Applied Physics Letters, pp. 1-4 (Jul. 2015), 4 pages.

Nagl et al., "Improving surface and defect center chemistry of fluorescent nanodiamonds for imaging purposes—a review," Analytical and Bioanalaytical Chemistry 407: 7521-7536 (Oct. 2015; published online Jul. 29, 2015), 16 pages.

Neumann et al., "Excited-state spectroscopy of single NV defects in diamond using optically detected magnetic resonance," New Journal of Physics 11(013017): 1-10, (Jan. 2009), 11 pages.

Nizovtsev & Kilin, "Optically Detected Magnetic Resonance Spectra of the 14NV-13C Spin Systems in Diamond: Analytical Theory and Experiment," Doklady of the National Academy of Sciences of Belarus, (2013), 27 pages with English machine translation.

Nizovtsev et al., "Modeling fluorescence of single nitrogen-vacancy defect centers in diamond," Physica B—Condensed Matter, 608-611 (Dec. 2001), 4 pages.

Nizovtsev et al., "Theoretical study of hyperfine interactions and optically detected magnetic resonance spectra by simulation of the C-291(NV)H-(172) diamond cluster hosting nitrogen-vacancy center," New Journal of Physics 16(083014): 1-21 (Aug. 2014), 22 pages.

Nobauer et al., "Smooth optimal quantum control for robust solid state spin magnetometry," Retrieved from http://www.arxiv.org/abs/1412.5051, pp. 1-12, (Dec. 2014), 12 pages.

Nowodzinski et al., "Nitrogen-Vacancy centers in diamond for current imaging at the redistributive layer level of Integrated Circuits," Microelectronics Reliability 55: 1549-1553 (Aug. 2015), 5 pages.

Nusran et al., "Optimizing phase-estimation algorithms for diamond spin magnetometry," Physical Review B 90(024422): 1-12 (Jul. 2014), 12 pages.

Ohashi et al., "Negatively Charged Nitrogen-Vacancy Centers in a 5 nm Thin 12C Diamond Film," Nano Letters 13: 4733-4738 (Oct. 2013), 6 pages.

Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.

Plakhotnik et al., "Super-Paramagnetic Particles Chemically Bound to Luminescent Diamond : Single Nanocrystals Probed with Optically Detected Magnetic Resonance," Journal of Physical Chemistry C 119: 20119-20124 (Aug. 2015), 6 pages.

Polatomic. "AN/ASQ-233A Digital Magnetic Anomaly Detective Set." Retrieved May 9, 2016, from http://polatomic.com/images/DMAD_Data_Sheet_09-2009.pdf (2009), 1 page.

Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.

Qiu et al., "Low-field NMR Measurement Procedure when SQUID Detection is Used," IEEE/CSC & ESAS European Superconductivity News Forum, No. 5, Jul. 2008.

Qiu, et al. "Squid-detected NMR in Earth's magnetic field." Journal of Physics: Conference Series. vol. 97. No. 1. IOP Publishing, Mar. 2008, pp. 1-7.

Rabeau et al., "Implantation of labelled single nitrogen vacancy centers in diamond using 15N," Applied Physics Letters 88, (Jan. 2006), 4 pages.

Ramsey, et al., "Phase Shifts in the Molecular Beam Method of Separated Oscillating Fields", Physical Review, vol. 84, No. 3, Nov. 1, 1951, pp. 506-507.

Ranjbar et al., "Many-electron states of nitrogen-vacancy centers in diamond and spin density calculations," Physical Review B 84(165212): 1-6 (Oct. 2011), 6 pages.

Reynhardt, "Spin-lattice relaxation of spin-1/2 nuclei in solids containing diluted paramagnetic impurity centers. I. Zeeman polarization of nuclear spin system," Concepts in Magnetic Resonance Part A, pp. 20-35, (Sep. 2003), 16 pages.

Rogers et al., "Singlet levels of the NV(−) centre in diamond," New Journal of Physics 17, (Jan. 2015), 13 pages.

Rondin et al., "Magnetometry with nitrogen-vacancy defects in diamond," Reports on Progress in Physics 77(056503) 1-26 (May 2014), 27 pages.

Rondin et al., "Magnetometry with nitrogen-vacancy defects in diamond." May 22, 2014 (May 22 2014), pp. 1 [online] http://arxiv.org/pdf/1311.5214.pdf, 29 pages.

Rondin et al., "Nanoscale magnetic field mapping with a single spin scanning probe magnetometer," Applied Physics Letters 100, (Apr. 2012), 5 pages.

Sarkar et al., "Magnetic properties of graphite oxide and reduced graphene oxide," Physica E 64: 78-82 (Nov. 2014), 5 pages.

Scheuer et al., "Accelerated 2D magnetic resonance spectroscopy of single spins using matrix completion," Scientific Reports 5(17728): 1-8 (Dec. 2015), 8 pages.

Schirhagl et al., "Nitrogen-vacancy centers in diamond: Nanoscale sensors for physics and biology," Annual Review of Physical Chemistry 65: 83-105 (Jan. 2014), 26 pages.

Schoenfeld & Harneit, "Real time magnetic field sensing and imaging using a single spin in diamond," Physical Review Letters 106(030802): 1-4 (Jan. 2011), 4 pages.

Sedov et al., "Si-doped nano- and microcrystalline diamond films with controlled bright photoluminescence of silicon-vacancy color centers," Diamond and Related Materials 56: 23-28 (Jun. 2015; available online Apr. 18, 2015), 6 pages.

Shames et al., "Magnetic resonance tracking of fluorescent nanodiamond fabrication," Journal of Physics D: Applied Physics 48(155302): 1-13 (Apr. 2015; published Mar. 20, 2015), 14 pages.

Shao et al., "Diamond Color Center Based Fm Microwave Demodulator," in Conference on Lasers and Electro-Optics, OSA Technical Digest (online) (Optical Society of America), paper JTh2A.136, (Jun. 5-10, 2016), 2 pages.

Sheinker et al., "Localization in 3-D Using Beacons of Low Frequency Magnetic Field." IEEE Transactions on Instrumentation and Measurement 62(12): 3194-3201 (Dec. 2013), 8 pages.

Simanovskaia et al., "Sidebands in optically detected magnetic resonance signals of nitrogen vacancy centers in diamond," Physical Review B 87(224106): 1-11 (Jun. 2013), 11 pages.

Sotoma et al., "Effective production of fluorescent nanodiamonds containing negatively-charged nitrogen-vacancy centers by ion irradiation," Diamond and Related Materials 49: 33-38 (Oct. 2014), 6 pages.

Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.

Steiner et al., "Universal enhancement of the optical readout fidelity of single electron spins at nitrogen-vacancy centers in diamond," Physical Review B 81(035205): 1-6 (Jan. 2010), 6 pages.

(56) References Cited

OTHER PUBLICATIONS

Steinert et al., "High-sensitivity magnetic imaging using an array of spins in diamond," Rev. Sci. Inst. 81(043705): 1-5 (Apr. 23, 2010), 5 pages.
Steinert et al., "Magnetic spin imaging under ambient conditions with sub-cellular resolution." Nature Comms 4:1607 (Mar. 19, 2013).
Stepanov et al., "High-frequency and high-field optically detected magnetic resonance of nitrogen-vacancy centers in diamond," Applied Physics Letters 106, (Feb. 2015), 5 pages.
Sternschulte et al., "Uniaxial stress and Zeeman splitting of the 1.681 eV optical center in a homoepitaxial CVD diamond film," Diamond and Related Materials 4: 1189-1192 (Sep. 1995), 4 pages.
Storteboom et al., "Lifetime investigation of single nitrogen vacancy centres in nanodiamonds," Optics Express 23(9): 11327-11333 (May 4, 2015; published Apr. 22, 2015), 7 pages.
Sushkov, et al. "All-optical sensing of a single-molecule electron spin." Nano letters 14.11 (Nov. 7, 2013): 6443-6448.
Tahara et al., "Quantifying selective alignment of ensemble nitrogen-vacancy centers in (111) diamond," Applied Physics Letters 107:193110 (Nov. 2015; published online Nov. 13, 2015), 5 pages.
Taylor et al., "High-sensitivity diamond magnetometer with nanoscale resolution," Nature Physics 4: 810-816 (Oct. 2008), 7 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
Terblanche et al., "13C spin-lattice relaxation in natural diamond: Zeeman relaxation at 4.7 T and 300 K due to fixed paramagnetic nitrogen defects," Solid State Nuclear Magnetic Resonance 20: 1-22 (Aug. 2001), 22 pages.
Terblanche et al., "13C spin-lattice relaxation in natural diamond: Zeeman relaxation in fields of 500 to 5000 G at 300 K due to fixed paramagnetic nitrogen defects," Solid State Nuclear Magnetic Resonance 19: 107-129 (May 2001), 23 pages.
Tetienne et al., "Magnetic-field-dependent photodynamics of single NV defects in diamond: an application to qualitative all-optical magnetic imaging," New Journal of Physics 14(103033): 1-5 (Oct. 2012), 16 pages.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
Tong et al., "A hybrid-system approach for W state and cluster state generation," Optics Communication 310: 166-172, (Jan. 2014; available online Aug. 12, 2013), 7 pages.
Uhlen et al., "New diamond nanofabrication process for hard x-ray zone plates," J. of Vacuum Science & Tech. B 29(6) (06FG03): 1-4 (Nov./Dec. 2011), 4 pages.
U.S. Notice of Allowance dated Apr. 20, 2016, from related U.S. Appl. No. 15/003,718, 9 pages.
U.S. Notice of Allowance dated Aug. 11, 2017 from related U.S. Appl. No. 15/003,558, 5 pages.
U.S. Notice of Allowance dated Aug. 17, 2016, from related U.S. Appl. No. 15/003,718, 8 pages.
U.S. Notice of Allowance dated Dec. 13, 2016, from related U.S. Appl. No. 14/680,877, 8 pages.
U.S. Notice of Allowance dated Dec. 22, 2016, from related U.S. Appl. No. 14/659,498, 10 pages.
U.S. Notice of Allowance dated Feb. 14, 2017, from related U.S. Appl. No. 15/003,677, 8 pages.
U.S. Notice of Allowance dated Jul. 18, 2017 from related U.S. Appl. No. 15/003,634, 6 pages.
U.S. Notice of Allowance dated Jul. 24, 2017 from related U.S. Appl. No. 15/003,088, 12 pages.
U.S. Notice of Allowance dated Jun. 20, 2017, from related U.S. Appl. No. 15/204,675, 9 pages.
U.S. Notice of Allowance dated Jun. 28, 2017, from related U.S. Appl. No. 15/003,256, 10 pages.
U.S. Notice of Allowance dated Jun. 8, 2017, from related U.S. Appl. No. 15/351,862, 7 pages.
U.S. Notice of Allowance dated Mar. 15, 2017, from related U.S. Appl. No. 15/351,862, 6 pages.
U.S. Notice of Allowance dated Mar. 29, 2016, from related U.S. Appl. No. 15/003,590, 11 pages.
U.S. Notice of Allowance dated May 26, 2017 from related U.S. Appl. No. 15/218,821, 7 pages.
U.S. Notice of Allowance dated Sep. 1, 2017, from related U.S. Appl. No. 14/676,740, 7 pages.
U.S. Notice of Allowance dated Sep. 14, 2017, from related U.S. Appl. No. 15/476,636, 10 pages.
U.S. Notice of Allowance dated Sep. 18, 2017, from related U.S. Appl. No. 15/003,206, 11 pages.
U.S. Notice of Allowance dated Sep. 26, 2017, from related U.S. Appl. No. 15/003,281, 7 pages.
U.S. Notice of Allowance dated Sep. 8, 2016, from related U.S. Appl. No. 15/003,298, 10 pages.
U.S. Office Action dated Apr. 17, 2017, from related U.S. Appl. No. 15/003,558, 12 pages.
U.S. Office Action dated Aug. 15, 2017 from related U.S. Appl. No. 15/003,281, 12 pages.
U.S. Office Action dated Aug. 24, 2016 from related U.S. Appl. No. 14/676,740, 19 pages.
U.S. Office Action dated Feb. 10, 2017, from related U.S. Appl. No. 14/676,740, 20 pages.
U.S. Office Action dated Feb. 10, 2017, from related U.S. Appl. No. 15/003,088, 11 pages.
U.S. Office Action dated Feb. 16, 2017, from related U.S. Appl. No. 15/204,675, 7 pages.
U.S. Office Action dated Jul. 27, 2017 from related U.S. Appl. No. 15/003,577, 15 pages.
U.S. Office Action dated Jul. 29, 2016 from related U.S. Appl. No. 14/680,877, 8 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Jun. 2, 2017, from related U.S. Appl. No. 15/476,636, 10 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.
U.S. Office Action dated May 13, 2016, from related U.S. Appl. No. 14/676,740, 15 pages.
U.S. Office Action dated May 22, 2017, from related U.S. Appl. No. 15/003,206, 12 pages.
U.S. Office Action dated May 6, 2016, from related U.S. Appl. No. 14/659,498.
U.S. Office Action dated Nov. 2, 2016, from related U.S. Appl. No. 15/003,256, 19 pages.
U.S. Office Action dated Nov. 3, 2016, from related U.S. Appl. No. 15/204,675, 9 pages.
U.S. Office Action dated Oct. 14, 2016 from related U.S. Appl. No. 15/003,677, 13 pages.
U.S. Office Action dated Oct. 19, 2016, from related U.S. Appl. No. 15/218,821, 6 pages.
U.S. Office Action dated Sep. 27, 2017, from related U.S. Appl. No. 15/003,176, 8 pages.
U.S. Office Action dated Sep. 8, 2017, from related U.S. Appl. No. 15/003,292, 8 pages.
Vershovskii & Dmitriev, "Combined excitation of an optically detected magnetic resonance in nitrogen-vacancy centers in diamond for precision measurement of the components of a magnetic field vector," Technical Physics Letters 41(11): 1026-1029 (Nov. 2015), 4 pages.

(56) References Cited

OTHER PUBLICATIONS

Vershovskii & Dmitriev, "Micro-scale three-component quantum magnetometer based on nitrogen-vacancy color centers in diamond crystal," Technical Physics Letters 41(4): 393-396 (Apr. 2015), 4 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013), 5 pages.
Wang et al., "Optimizing ultrasensitive single electron magnetometer based on nitrogen-vacancy center in diamond," Chinese Science Bulletin, 58(24): 2920-2923, (Aug. 2013), 4 pages.
Webber et al., "Ab initio thermodynamics calculation of the relative concentration of NV- and NV0 defects in diamond," Physical Review B 85,(014102): 1-7 (Jan. 2012), 7 pages.
Wells, et al. "Assessing graphene nanopores for sequencing DNA." Nano letters 12.8 (Jul. 10, 2012): 4117-4123.
Widmann et al., "Coherent control of single spins in silicon carbide at room temperature," Nature Materials, 14: 164-168 (2015) (available online Dec. 1, 2014), 5 pages.
Wolf et al., "Subpicotesla Diamond Magnetometry," Physical Review X 5(041001): 1-10 (Oct. 2015), 10 pages.
Wolfe et al., "Off-resonant manipulation of spins in diamond via precessing magnetization of a proximal ferromagnet," Physical Review B 89(180406): 1-5 (May 2014), 5 pages.
Wroble, "Performance Analysis of Magnetic Indoor Local Positioning System." Western Michigan University Master's Theses, Paper 609 (Jun. 2015), 42 pages.
Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.
Xue & Liu, "Producing GHZ state of nitrogen-vacancy centers in cavity QED," Journal of Modern Optics 60(6-7), (Mar. 2013), 8 pages.
Yang & Gu, "Novel calibration techniques for high pulsed-magnetic fields using luminescence caused by photo," (with English machine translation), Journal of Huazhong University of Science and Technology, (Jun. 2007), 11 pages.
Yavkin et al., "Defects in Nanodiamonds: Application of High-Frequency cw and Pulse EPR, ODMR," Applied Magnetic Resonance, 45: 1035-1049 (Oct. 2014; published online Sep. 10, 2014), 15 pages.
Yu et al., "Bright fluorescent nanodiamonds: no photobleaching and low cytotoxicity," J. Am. Chem. Soc., 127: 17604-17605 (Nov. 25, 2005), 2 pages.
Zhang et al., "Laser-polarization-dependent and magnetically controlled optical bistability in diamond nitrogen-vacancy centers," Physics Letters A 377: 2621-2627 (Nov. 2013), 7 pages.
Zhang et al., "Laser-polarization-dependent spontaneous emission of the zero phonon line from single nitrogen-vacancy center in diamond," Chinese Physics B 24(3), (Apr. 2014), 13 pages.
Zhang et al., "Scalable quantum information transfer between nitrogen-vacancy-center ensembles," Annals of Physics, 355: 170-181 (Apr. 2015; available online Feb. 14, 2013), 12 pages.
Zhao et al., "Atomic-scale magnetometry of distant nuclear spin clusters via nitrogen-vacancy spin in diamond," Nature Nanotechnology, 5: 242-246 (Apr. 2011), 5 pages.
Teeling-Smith et al., "Electron Paramagnetic Resonance of a Single NV Nanodiamond Attached to an Individual Biomolecule", Biophysical Journal 110, May 10, 2016, pp. 2044-2052.
UK Office Action dated Jun. 8, 2018, from related application No. GB1617438.5, 3 pages.
U.S. Final Office Action dated Jul. 26, 2018 from related U.S. Appl. No. 15/003,177, 14 pages.
U.S. Non-Final Office Action dated Aug. 6, 2018 from related U.S. Appl. No. 15/376,244, 28 pages.
U.S. Non-Final Office Action dated Aug. 9, 2018 from related U.S. Appl. No. 15/003,309, 22 pages.
U.S. Non-Final Office Action dated Jul. 20, 2018 from related U.S. Appl. No. 15/350,303, 13 pages.
U.S. Non-Final Office Action dated Jul. 26, 2018 from related U.S. Appl. No. 15/380,419, 11 pages.
U.S. Non-Final Office Action dated Jul. 3, 2018 from related U.S. Appl. No. 15/003,396, 19 pages.
U.S. Notice of Allowance dated Jul. 18, 2018 from related U.S. Appl. No. 15/468,386, 12 pages.
U.S. Notice of Allowance dated Jul. 6, 2018 from related U.S. Appl. No. 15/672,953, 11 pages.
U.S. Notice of Allowance dated Jun. 27, 2018 from related U.S. Appl. No. 15/003,519, 21 pages.
U.S. Notice of Allowance dated May 15, 2018, from related U.S. Appl. No. 15/003,209, 7 pages.
U.S. Notice of Allowance dated May 16, 2018, from related U.S. Appl. No. 15/003,145, 8 pages.
U.S. Office Action dated Jun. 19, 2018, from related U.S. Appl. No. 15/450,504, 12 pages.
U.S. Notice of Allowance dated Oct. 19, 2017, from related U.S. Appl. No. 15/179,957, 5 pages.
U.S. Notice of Allowance dated Oct. 23, 2017, from related U.S. Appl. No. 15/003,797, 6 pages.
U.S. Office Action dated Nov. 24, 2017, from related U.S. Appl. No. 15/003,145, 14 pages.
U.S. Office Action dated Nov. 27, 2017, from related U.S. Appl. No. 15/468,386, 28 pages.
European Extended Search Report for Appl. Ser. No. 16743879.5 dated Sep. 11, 2018, 11 pages.
European Extended Search Report for Appl. Ser. No. 16800410.9 dated Oct. 12, 2018, 11 pages.
Fenglian Niu, "Crack Detection of Power Line Based on Metal Magnetic Memory Non-destructive", TELKOMNIKA Indonesian Journal of Electrical Engineering, vol. 12, No, 11, Nov. 1, 2014, pp. 7764-7771.
U.S. Final Office Action for U.S. Appl. No. 15/380,691 dated Sep. 21, 2018, 12 pages.
U.S. Final Office Action for U.S. Appl. No. 15/479,256 dated Sep. 10, 2018, 20 pages.
U.S Non-Final Office Action for U.S. Appl. No. 15/446,373 dated Oct. 1, 2018, 13 pages.
U.S. Non-Final Office Action for U.S. Appl. No. 15/454,162 dated Sep. 10, 2016, 13 pages.
U.S. Non-Final Office Action for U.S. Appl. No. 15/468,282 dated Oct. 10, 2018, 12 pages.
U.S. Non-Final Office Action for U.S. Appl. No. 15/372,201 dated Oct. 15, 2018, 12 pages.
U.S. Non-Final Office Action for U.S. Appl. No. 15/468,274 dated Oct. 26, 2018, 11 pages.
U.S. Notice of Allowance for U.S. Appl. No. 14/866,730 dated Aug. 15, 2018, 9 pages.
U.S. Notice of Allowance for U.S. Appl. No. 15/468,289 dated Oct. 17, 2018, 12 pages.
U.S. Notice of Allowance for U.S. Appl. No. 15/003,704 dated Nov. 2, 2018, 19 pages.
U.S. Office Action for U.S. Appl. No. 15/468,397 dated Sep. 13, 2018, 7 pages.
European Extended Search Report for Appl. Ser. No. 16740794.9 dated Nov. 12, 2018, 12 pages.
Halbach et al., "Design of Permanent Multipole Magnets with Oriented Rare Earth Cobalt Material", Nuclear Instruments and Methods, North Holland Publishing Co., Amsterdam, NL., vol. 169, Jan. 1, 1980, pp. 1-5, XP001032085, DOI: 10.1016/0029-554X(80) 90094-4.
Hodges et al., "Time-keeping with electron spin states in diamond", Dept. of Electrical Engineering and Dept. of Applied Physics and Applied Mathematics, Columbia University, New York, New York 10027, Aug. 30, 2011, 13 pages.
Hodges et al., Appendix, "Time-keeping with electron spin states in diamond", Dept. of Electrical Engineering and Dept. of Applied Physics and Applied Mathematics, Columbia University, New York, New York 10027, Aug. 27, 2012, 46 pages.
International Search Report and Written Opinion for PCT Appl. Ser. No. PCT/US2018/041527 dated Feb. 4, 2019, 22 pages.

(56) References Cited

OTHER PUBLICATIONS

U.S. Ex Parte Quayle Action for U.S. Appl. No. 15/468,641 dated Nov. 28, 2018, 11 pages.
U.S. Non-Final Office Action for U.S. Appl. No. 15/003,177 dated Jan. 14, 2019, 15 pages.
U.S. Non-Final Office Action for U.S. Appl. No. 15/003,670 dated Nov. 27, 2018, 14 pages.
U.S. Non-Final Office Action for U.S. Appl. No. 15/382,045 dated Dec. 31, 2018, 16 pages.
U.S. Non-Final Office Action for U.S. Appl. No. 15/400,794 dated Jan. 10, 2019, 6 pages.
U.S. Non-Final Office Action for U.S. Appl. No. 15/468,356 dated Jan. 2, 2019, 10 pages.
U.S. Non-Final Office Action for U.S. Appl. No. 15/468,951 dated Dec. 13, 2018, 9 pages.
U.S. Notice of Allowance for U.S. Appl. No. 15/003,670 dated Feb. 1, 2019, 7 pages.
U.S. Notice of Allowance for U.S. Appl. No. 15/350,303 dated Dec. 26, 2018, 10 pages.
U.S. Notice of Allowance for U.S. Appl. No. 15/450,504 dated Dec. 13, 2018, 7 pages.
U.S. Notice of Allowance for U.S. Appl. No. 15/454,162 dated Jan. 17, 2019, 8 pages.
U.S. Notice of Allowance for U.S. Appl. No. 15/468,397 dated Dec. 12, 2018, 5 pages.
U.S. Notice of Allowance for U.S. Appl. No. 15/468,641 dated Feb. 7, 2019, 10 pages.
U.S. Notice of Allowance for U.S. Appl. No. 15/479,256 dated Feb. 4, 2019, 7 pages.
International Search Report and Written Opinion for PCT Appl. Ser. No. PCT/US2018/041411 dated Feb. 8, 2019, 13 pages.
Rosskopf, "Advanced quantum sensing using nitrogen vacancy centers in diamond", Dissertation, ETH Zurich, 2016, p. 91 (12 pages), XP055500261, DOI: 10.3929/ethz-b-000168296 Retrieved from the Internet: URL: https://epo.summon.serialssolutions.com/2.0.0/link/0/elvHCXMwY2BQsUxJMUs0MJTWNQWwlomqZYWuolJ5qa6qaagq5BSjEzMLUG7kSOdTULczYPcTXwQHUXQqkUWXXQ_a21WpJRpZukC2gWBthjEzsAJbAuaWkH1 HrEqAZSiojWVyZkkqUoXhJsjA44100S3EwJSaJ8Lg5AidcFcoLAV6qDRXoRiOfDwvXaEUTAJzV1E-MEIVyllKTQYWeAmJlJLB5ppCZpwCMRmCCSRFIMHVzDXH201X.
Schonfeld, "Optical readout of single spins for quantum computing and magnetic sensing", Dissertation, Fachbereich Physlk der Freien Universitat Berlin, May 1, 2011, 21 Pages (relevant pages only), XP055143403. Retrieved from the Internet: URL: http://www.dlss.fu-berlin.de/diss/servlets/MCRFlleNodeServleUFU DISS_derivate_00000001219 9/Dlssertation_Slmon-choenfela_PubllcVersion-2.pdfJsessionid-89A943688E59.
U.S. Final OfficeAction for U.S. Appl. No. 15/003,396 dated Mar. 22, 2019, 13 pages.
U.S. Final Office Action for U.S. Appl. No. 15/382,045 dated Apr. 26, 2019, 16 pages.
U.S. Non-Final Office Action for U.S. Appl. No. 15/003,193 dated Apr. 11, 2019, 7 pages.
U.S. Non-Final Office Action for U.S. Appl. No. 15/003,309 dated Feb. 13, 2019, 16 pages.
U.S. Non-Final Office Action for U.S. Appl. No. 15/003,617 dated Feb. 26, 2019, 10 pages.
U.S. Non-Final Office Action for U.S. Appl. No. 15/372,201 dated Apr. 2, 2019, 10 pages.
U.S. Non-Final Office Action for U.S. Appl. No. 15/419,832 dated Feb. 8, 2019, 12 pages.
U.S. Non-Final Office Action for U.S. Appl. No. 15/440,194 dated Feb. 15, 2019, 21 pages.
U.S. Non-Final Office Action for U.S. Appl. No. 15/446,373 dated Apr. 19, 2019, 8 pages.
U.S. Non-Final Office Action for U.S. Appl. No. 15/468,314 dated Mar. 28, 2019, 17 pages.
U.S. Non-Final Office Action for U.S. Appl. No. 15/468,410 dated Apr. 11, 2019, 15 pages.
U.S. Non-Final Office Action for U.S. Appl. No. 15/468,559 dated Apr. 11, 2019, 12 pages.
U.S. Non-Final Office Action for U.S. Appl. No. 15/469,374 dated Feb. 28, 2019, 14 pages.
U.S. Notice of Allowance for U.S. Appl. No. 15/003,617 dated Apr. 30, 2019, 9 pages.
U.S. Notice of Allowance for U.S. Appl. No. 15/207,457 dated Mar. 6, 2019, 16 pages.
U.S. Notice of Allowance for U.S. Appl. No. 15/376,244 dated Feb. 21, 2019, 7 pages.
U.S. Notice of Allowance for U.S. Appl. No. 15/380,419 dated Feb. 26, 2019, 5 pages.
U.S. Notice of Allowance for U.S. Appl. No. 15/400,794 dated Apr. 25, 2019, 5 pages.
U.S. Notice of Allowance for U.S. Appl. No. 15/437,038 dated Mar. 21, 2019, 13 pages.
U.S. Notice of Allowance for U.S. Appl. No. 15/437,222 dated Mar. 25, 2019, 11 pages.
U.S. Notice of Allowance for U.S. Appl. No. 15/468,282 dated Feb. 19, 2019, 8 pages.
U.S. Notice of Allowance for U.S. Appl. No. 15/468,356 dated Apr. 22, 2019, 8 pages.
U.S. Notice of Allowance for U.S. Appl. No. 15/468,582 dated Mar. 21, 2019, 13 pages.
U.S. Notice of Allowance for U.S. Appl. No. 15/468,951 dated Mar. 28, 2019, 8 pages.
International Search Report and Written Opinion for PCT Appl. Ser. No. PCT/US2019/022097, dated May 15, 2019, 13 pages.
U.S. Final Office Action for U.S. Appl. No. 15/003,309, dated May 23, 2019, 8 pages.
U.S. Non-Final Office Action for U.S. Appl. No. 15/468,274, dated May 14, 2019, 15 pages.
U.S. Non-Final Office Action for U.S. Appl. No. 15/468,303, dated Jun. 25, 2019, 14 pages.
U.S. Notice of Allowance for U.S. Appl. No. 15/419,832, dated Jun. 24, 2019, 5 pages.
U.S. Notice of Allowance for U.S. Appl. No. 15/469,374, dated Jun. 20, 2019, 5 pages.

* cited by examiner

ARRAY OF UAVS WITH MAGNETOMETERS

CROSS REFERENCE TO RELATED APPLICATIONS

The present application claims the priority of U.S. Application No. 62/343,842, filed May 31, 2016, of U.S. Application No. 62/343,839, filed May 31, 2016, and of U.S. Application No. 62/343,600, filed May 31, 2016, all of which are incorporated herein by reference in their entirety.

BACKGROUND

Various locating techniques use scalar measurements to determine the location of items. For example, radar can use triangulation to determine the location of an object such as an airplane. However, scalar measurements are limited in their use because they include only a magnitude of measurement.

SUMMARY

An illustrative system includes a plurality of unmanned aerial systems (UASs) and a plurality of magnetometers each attached to a respective one of the UASs. Each of the magnetometers are configured to generate a vector measurement of a magnetic field. The system also includes a central processing unit in communication with each of the plurality of magnetometers. The central processing unit is configured to receive, from each of the plurality of magnetometers, a first set of vector measurements and corresponding locations. The corresponding locations indicate where a respective magnetometer was when the respective vector measurement of the first set of vector measurements was taken. The central processing unit is also configured to generate a magnetic baseline map using the first set of vector measurements and receive, from a first magnetometer of the plurality of magnetometers, a first vector measurement and a first corresponding location. The central processing unit is further configured to compare the first vector measurement with the magnetic baseline map using the first corresponding location to determine a first difference vector and determine that a magnetic object is in an area corresponding to the area of the magnetic baseline map based on the first difference vector.

An illustrative method includes receiving, from each of a plurality of magnetometers, a first set of vector measurements and corresponding locations. Each of the magnetometers are attached to one of a plurality of unmanned aerial systems (UASs). Each of the magnetometers are configured to generate a vector measurement of a magnetic field. The corresponding locations indicate where a respective magnetometer was when the respective vector measurement of the first set of vector measurements was taken. The method also includes generating a magnetic baseline map using the first set of vector measurements and receiving, from a first magnetometer of the plurality of magnetometers, a first vector measurement and a first corresponding location. The method further includes comparing the first vector measurement with the magnetic baseline map using the first corresponding location to determine a first difference vector. The method also includes determining that a magnetic object is in an area corresponding to the area of the magnetic baseline map based on the first difference vector.

An illustrative system includes a plurality of magnetometers that are each configured to generate a vector measurement of a magnetic field. The system also includes a central processing unit that is communicatively coupled to each of the magnetometers. The central processing unit is configured to receive from each of the plurality of magnetometers the respective vector measurement of the magnetic field. The central processing unit is further configured to compare each of the vector measurements to determine differences in the vector measurements and to determine, based on the differences in the vector measurements, that a magnetic object is near the plurality of magnetometers.

An illustrative method includes receiving, from each of a plurality of magnetometers, a respective vector measurement of a magnetic field. The method also includes comparing each of the vector measurements to determine differences in the vector measurements. The method further includes determining, based on the differences in the vector measurements, that a magnetic object is near the plurality of magnetometers.

An illustrative system includes a first magnetometer configured to detect a first vector measurement of a magnetic field. The magnetic field is generated by a magnetic device. The system also includes a second magnetometer configured to detect a second vector measurement of the magnetic field. The first magnetometer and the second magnetometer are spaced apart from one another. The system further includes a processor in communication with the first magnetometer and the second magnetometer. The processor is configured to determine a location of the magnetic device in a three-dimensional space based on the first vector measurement and the second vector measurement.

The foregoing summary is illustrative only and is not intended to be in any way limiting. In addition to the illustrative aspects, embodiments, and features described above, further aspects, embodiments, and features will become apparent by reference to the following drawings and the detailed description.

Figure 1A:
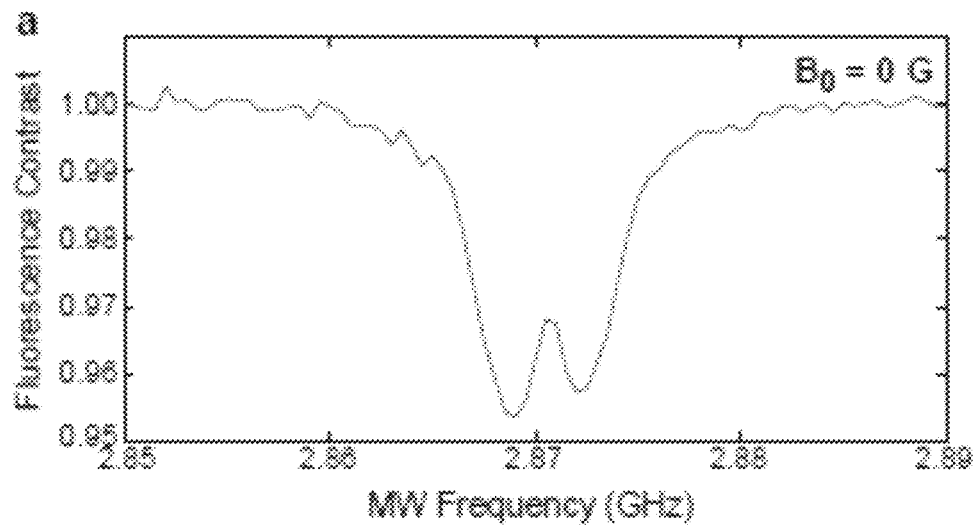
FIGS. 1A and 1B are graphs illustrating the frequency response of a DNV sensor in accordance with some illustrative embodiments.

The foregoing and other features will become apparent from the following description and appended claims, taken in conjunction with the accompanying drawings. Understanding that these drawings depict only several embodiments and are, therefore, not to be considered limiting of scope of the disclosure, which will be described with additional specificity and detail through use of the accompanying description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects, as generally described herein, and illustrated in the figures, can be arranged, substituted, combined, and designed in a wide variety of different configurations, all of which are explicitly contemplated and make part of this disclosure.

In various embodiments described herein, an array of magnetometers may be used to locate a magnetic object, such as a ferromagnetic or paramagnetic object. Multiple magnetometers are distributed across an area, which can be a two-dimensional area (e.g., the surface of a body of water) or a three-dimensional area (e.g., along a water column or attached to unmanned aerial vehicles). The magnetometers are sensitive enough to detect relatively small changes in the sensed earth's magnetic field. Differences in the sensed earth's magnetic field from each of the magnetometers can be used to detect and determine the location of an object that interferes with the earth's magnetic field.

For example, multiple unmanned aerial systems (UASs) such as flying drones are each fitted with a magnetometer. The UASs fly around an area that may be monitored. Each of the magnetometers sense a vector measurement of the earth's magnetic field at the same time. The earth's magnetic field is the same (or substantially the same) for all of the UASs. Objects can alter the earth's magnetic field as sensed by the UASs. For example, vehicles such as cars, trucks, tanks, etc. that are made primarily of steel or other paramagnetic material deflect or alter the earth's magnetic field.

The UASs fly around the monitored area and take simultaneous measurements of the earth's magnetic field. Each of the measurements may be a vector measurement that includes a strength and direction of the earth's magnetic field. If the vehicle does not move over time, the earth's magnetic field detected by each of the UASs does not change over time at specific locations. If the vehicle moves, the vehicle's effect on the earth's magnetic field that is sensed by the UASs changes. The sensed change in the earth's magnetic field can be used to determine the location of the vehicle over time.

For example, each of the UASs sense the earth's magnetic field simultaneously. The simultaneous measurements can be compared to one another to determine anomalies or changes in the earth's magnetic field caused by a magnetic object. For example, if there is no magnetic object in the area that is being monitored, each of the UASs' sensed magnetic fields may be the same. That is, there is no object within the monitored area that may be altering or moving the earth's magnetic field. But, if there is a magnetic object that is within the monitored area, the earth's magnetic field sensed by each of the UASs will be slightly different depending upon the relative location of the magnetic object. For example, the vector measurement of a UAS that is close to the magnetic object will be different than the vector measurement of UASs that are relatively far away from the magnetic object. The difference in the vector measurements can be used to determine, for example, that the magnetic object exists and may be proximate to the UAS with the vector measurement that may be different than the other vector measurements.

In some such examples, once it is determined that the magnetic object exists and may be relatively close to a particular UAS, the fleet of UASs can be directed to the area of the magnetic object. Subsequent measurements can be taken to determine the location, size, shape, etc. of the magnetic object based on the sensed magnetic vectors and the location of the UASs. The UASs may be autonomous or may be controlled remotely.

In some embodiments described herein, the "magnetic object" may be a paramagnetic or a ferromagnetic object. In an alternative embodiment, the "magnetic object" may be (or include) an electromagnet. In other alternative embodiments, the "magnetic object" may be any object that alters the earth's magnetic field. For example, the "magnetic object" may be an object made of (or that includes) a material that alters the flux lines of the earth's magnetic field, but is not necessarily paramagnetic, ferromagnetic, or electromagnetic. In such an example, the material may not be magnetic, but may still alter the flux lines of the earth's magnetic field.

A diamond with a nitrogen vacancy (DNV) can be used to measure a magnetic field. DNV sensors generally have a quick response to magnetic fields, consume little power, and are accurate. Diamonds can be manufactured with nitrogen vacancy (NV) centers in the lattice structure of the diamond. When the NV centers are excited by light, for example green light, and microwave radiation, the NV centers emit light of a different frequency than the excitation light. For example, green light can be used to excite the NV centers, and red light can be emitted from the NV centers. When a magnetic field is applied to the NV centers, the frequency of the light emitted from the NV centers changes. Additionally, when the magnetic field is applied to the NV centers, the frequency of the microwaves at which the NV centers are excited changes. Thus, by shining a green light (or any other suitable color) through a DNV and monitoring the light emitted from the DNV and the frequencies of microwave radiation that excite the NV centers, a magnetic field can be monitored.

NV centers in a diamond are oriented in one of four spin states. Each spin state can be in a positive direction or a negative direction. The NV centers of one spin state do not respond the same to a magnetic field as the NV centers of another spin state. A magnetic field vector has a magnitude and a direction. Depending upon the direction of the magnetic field at the diamond (and the NV centers), some of the NV centers will be excited by the magnetic field more than others based on the spin state of the NV centers.

Figure 1B:
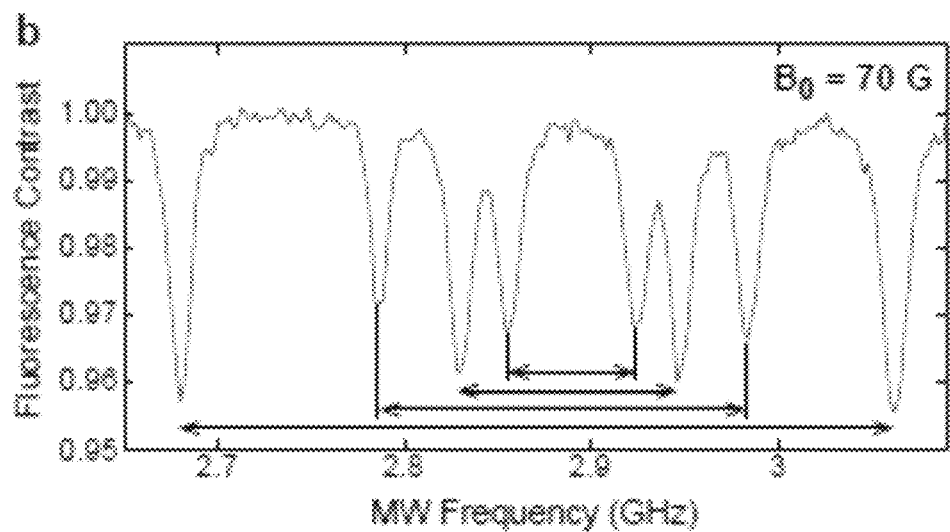

FIGS. 1A and 1B are graphs illustrating the frequency response of a DNV sensor in accordance with some illustrative embodiments. FIGS. 1A and 1B are meant to be illustrative only and not meant to be limiting. FIGS. 1A and 1B plot the frequency of the microwaves applied to a DNV sensor on the x-axis versus the amount of light of a particular frequency (e.g., red) emitted from the diamond. FIG. 1A is the frequency response of the DNV sensor with no magnetic field applied to the diamond, and FIG. 1B is the frequency response of the DNV sensor with a seventy gauss (G) magnetic field applied to the diamond.

As shown in FIG. 1A, when no magnetic field is applied to the DNV sensor, there are two notches in the frequency response. With no magnetic field applied to the DNV sensor, the spin states are not resolvable. That is, with no magnetic field, the NV centers with various spin states are equally excited and emit light of the same frequency. The two notches shown in FIG. 1A are the result of the positive and negative spin directions. The frequency of the two notches is the axial zero field splitting parameter.

When a magnetic field is applied to the DNV sensor, the spin states become resolvable in the frequency response. Depending upon the excitation by the magnetic field of NV centers of a particular spin state, the notches corresponding to the positive and negative directions separate on the frequency response graph. As shown in FIG. 1B, when a magnetic field is applied to the DNV sensor, eight notches appear on the graph. The eight notches are four pairs of corresponding notches. For each pair of notches, one notch corresponds to a positive spin state and one notch corresponds to a negative spin state. Each pair of notches corresponds to one of the four spin states of the NV centers. The amount by which the pairs of notches deviate from the axial zero field splitting parameter may be dependent upon how strongly the magnetic field excites the NV centers of the corresponding spin states.

As mentioned above, the magnetic field at a point can be characterized by a vector with a magnitude and a direction. By varying the magnitude of the magnetic field, all of the NV centers will be similarly affected. Using the graph of FIG. 1A as an example, the ratio of the distance from 2.87 GHz of one pair to another will remain the same when the magnitude of the magnetic field may be altered. As the magnitude is increased, each of the notch pairs will move away from 2.87 GHz at a constant rate, although each pair will move at a different rate than the other pairs.

When the direction of the magnetic field is altered, however, the pairs of notches do not move in a similar manner to one another. FIG. 2A is a diagram of NV center spin states in accordance with an illustrative embodiment. FIG. 2A conceptually illustrates the four spin states of the NV centers. The spin states are labeled NV A, NV B, NV C, and NV D. Vector 201 is a representation of a first magnetic field vector with respect to the spin states, and Vector 202 is a representation of a second magnetic field vector with respect to the spin states. Vector 201 and vector 202 have the same magnitude, but differ in direction. Accordingly, based on the change in direction, the various spin states will be affected differently depending upon the direction of the spin states.

Figure 2B:
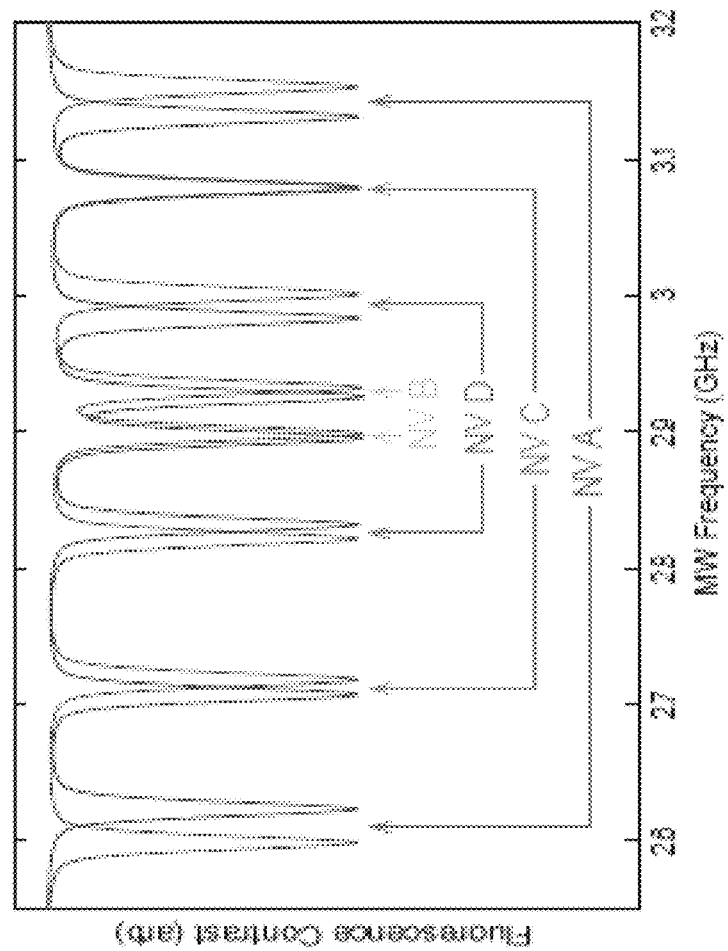
FIG. 2B is a graph illustrating the frequency response of a DNV sensor in response to a changed magnetic field in accordance with some illustrative embodiments.
Figure 2A:
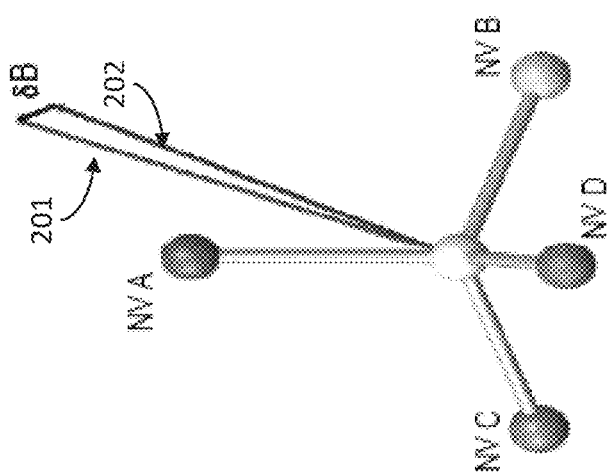
FIG. 2A is a diagram of NV center spin states in accordance with some illustrative embodiments.

FIG. 2B is a graph illustrating the frequency response of a DNV sensor in response to a changed magnetic field in accordance with some illustrative embodiments. The frequency response graph illustrates the frequency response of the DNV sensor from the magnetic field corresponding to vector 201 and to vector 202. As shown in FIG. 2B, the notches corresponding to the NV A and NV D spin states moved closer to the axial zero field splitting parameter from vector 201 to vector 202, the negative (e.g., lower frequency notch) notch of the NV C spin state moved away from the axial zero field splitting parameter, the positive (e.g., high frequency notch) of the NV C spin state stayed essentially the same, and the notches corresponding to the NV B spin state increased in frequency (e.g., moved to the right in the graph). Thus, by monitoring the changes in frequency response of the notches, the DNV sensor can determine the direction of the magnetic field.

Although specific mentions to DNV sensors are made, any other suitable magnetometer may be used. For example, any suitable DNV sensor that can determine the magnitude and angle of a magnetic field can be used. In an illustrative embodiment, a sensor that functions as described above may be used, even if the diamond material is replaced with a different magneto-optical defect center material. Furthermore, although nitrogen vacancies are described herein, any other suitable vacancy or defect may be used that functions in a similar manner. In yet other embodiments, any other suitable type of magnetometer that determines a magnitude and direction of a magnetic field can be used, even if such a magnetometer does not include a magneto-optical defect center material. That is, the various embodiments and/or techniques described herein need not be limited to a particular style or type of magnetometer and can use any suitable phenomena, physical characteristics, or mathematical principals. Although references to DNV sensors are made herein, the DNV sensors may be replaced with any other suitable type of magnetometer.

Figure 3A:
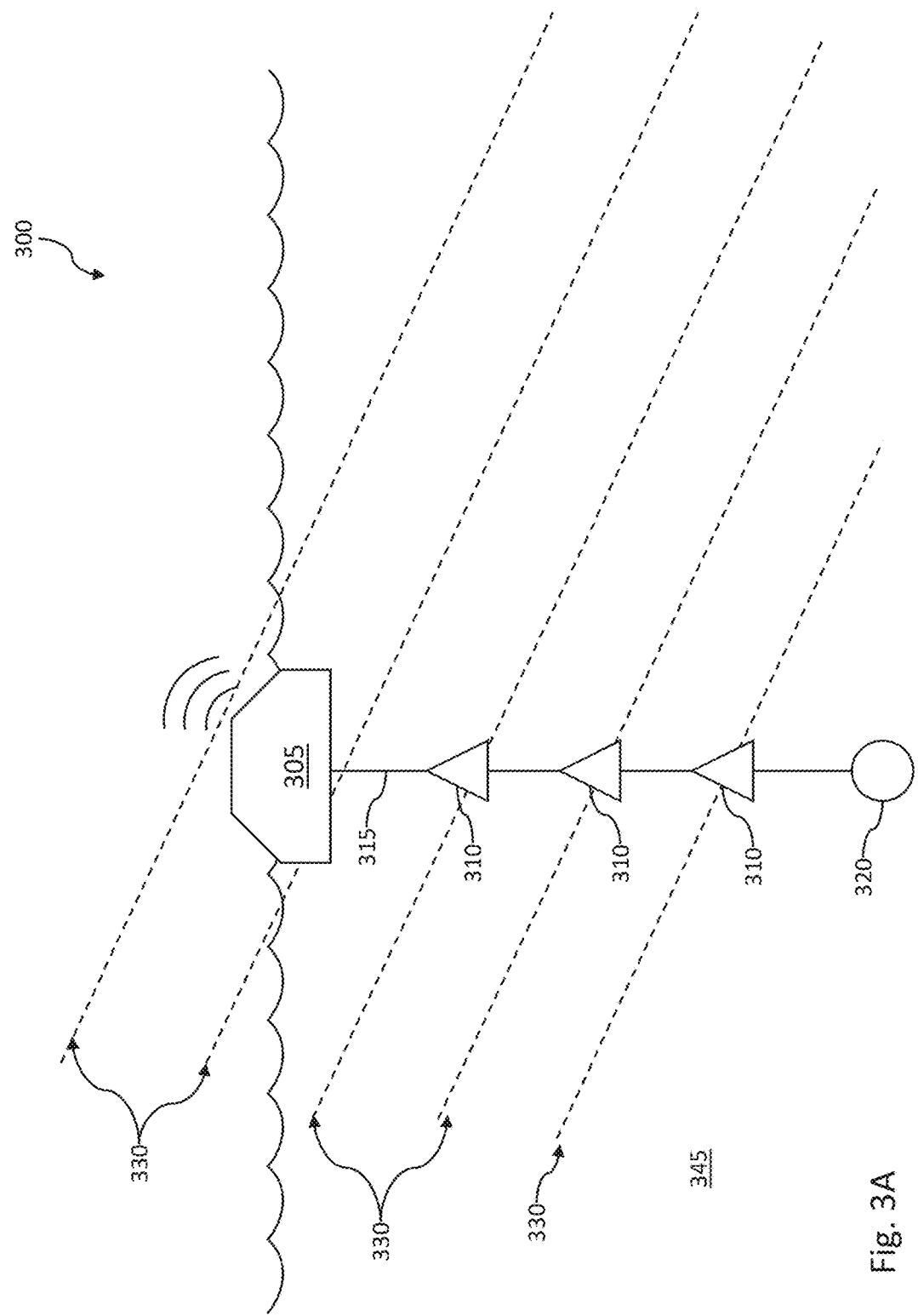
FIGS. 3A and 3B are diagrams of a buoy-based DNV sensor array in accordance with some illustrative embodiments.
Figure 3B:
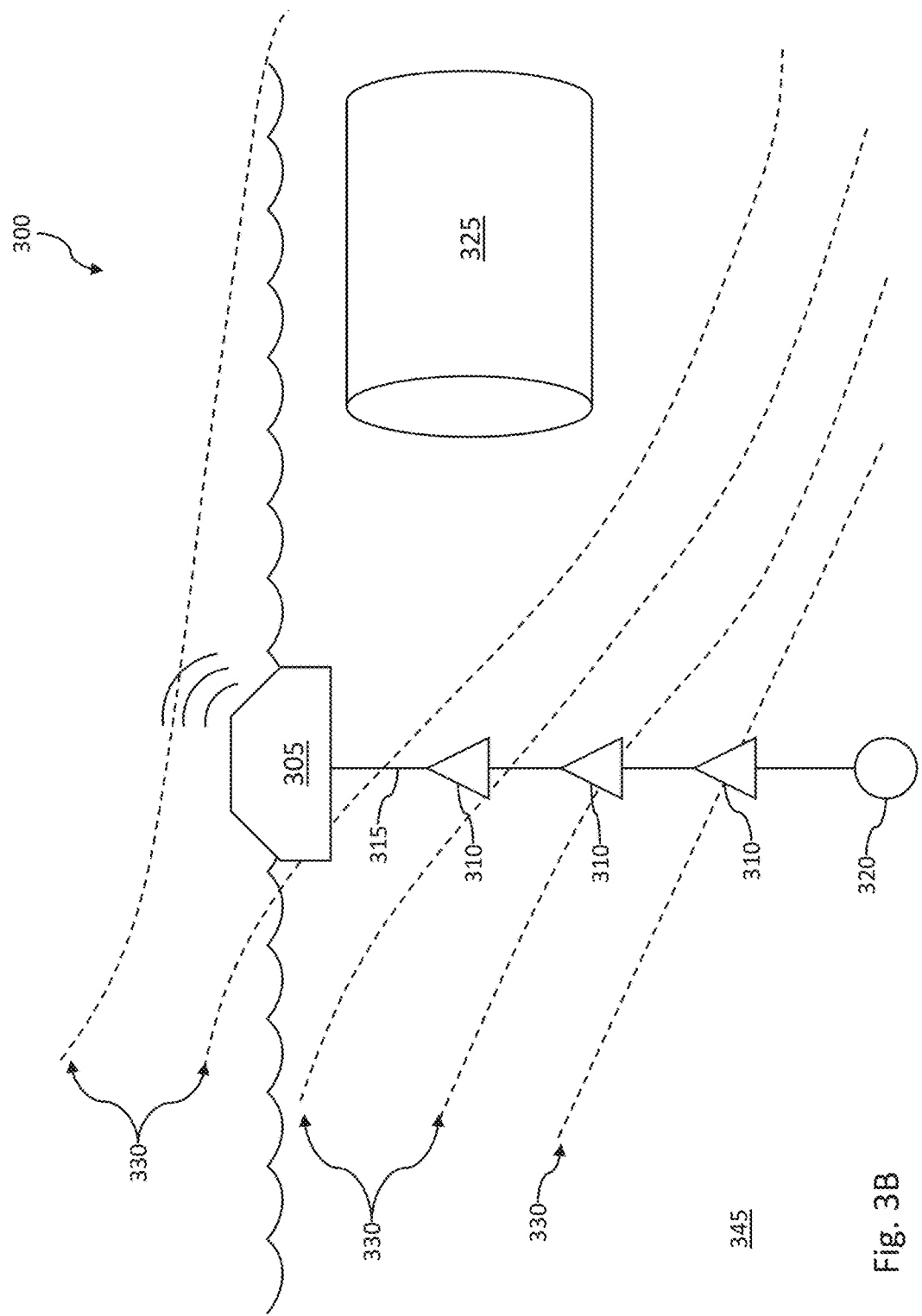

FIGS. 3A and 3B are diagrams of a buoy-based DNV sensor array in accordance with some illustrative embodiments. The system 300 includes a buoy 305, DNV sensors 310, a tether 315, and an anchor 320 in water 345. In FIG. 3A, there is no magnetic object 325 and the earth's magnetic flux lines 330 are relatively straight. In FIG. 3B, the magnetic object 325 causes a disturbance in the earth's magnetic field and causes a change in the earth's magnetic flux lines 330 as compared to the earth's magnetic flux lines of FIG. 3A. In alternative embodiments, additional, fewer, and/or different elements may be used. For example, the embodiments shown in FIGS. 3A and 3B each show three DNV sensors 310, but in alternative embodiments, more or less than three DNV sensor 310 may be used. Further, in alternative embodiments, each object labeled 310 in FIG. 3A may include more than one DNV sensor. For example, each object labeled 310 may include two, three, four, etc. DNV sensors.

In the system 300 of FIG. 3A, the DNV sensors 310 are attached to the buoy 305 via the tether 315. The buoy 305 floats at the surface of the water 345. In alternative embodiments, the buoy 305 can have any suitable density and may be suspended in the water 345. For example, the buoy 305 may be suspended slightly below the surface of the water 345. In some embodiments, the buoy 305 may include a propulsion system that can cause the buoy 305 to be moved through the water 345.

In some embodiments, the system 300 can include an inertial compensation system. For example, the inertial compensation system can be an electronic and/or software component that accounts for movement of the DNV sensors 310 and/or the buoy 305. For example, as the buoy 305 moves up and down or side to side with the waves of the water 345, the inertial compensation system can account for such movements. For example, in some embodiments, the DNV sensors 310 may not always be equally spaced apart, but may move with respect to one another depending upon the movement of the buoy 305. Any suitable inertial compensation system can be used. For example, an inertial compensation system may be implemented as software running on one or more processors of the buoy 305.

The DNV sensors 310 hang from the buoy 305 via the tether 315. The DNV sensors 310 are distributed along the tether 315 such that the DNV sensors 310 are at different depths. The anchor 320 may be attached at the end of the tether 315. In an illustrative embodiment, the anchor 320 sits on or is embedded in the floor of the body of water 345 (e.g., the bottom of the sea or ocean). For example, the anchor 320 can anchor the buoy 305 such that the buoy 305 may be relatively stationary and does not float away. In an alternative embodiment, the anchor 320 can hang from the buoy 305. In such an embodiment, the anchor 320 can be used to keep the tether 315 taut. In an alternative embodiment, the anchor 320 may not be used. For example, the tether 315 may be a rod.

In an illustrative embodiment, the buoy 305 includes electronics. For example, the buoy 305 can include a processor in communication with the DNV sensors 310. The buoy 305 can include a location sensor (e.g., a global positioning system (GPS) sensor). In an illustrative embodiment, the buoy 305 communicates wirelessly with a base station or remote server. For example, satellite communications can be used by the buoy 305 to communicate with external devices.

In an illustrative embodiment, the DNV sensors 310 communicate with the buoy 305 via the tether 315. For example, the tether 315 can include one or more communication wires with which the DNV sensors 310 communicate with the buoy 305. In alternative embodiments, any suitable method of communication can be used, such as wireless communication or fiber optics.

In an illustrative embodiment, the buoy 305 and the DNV sensors 310 are relatively stationary over time. That is, the anchor 320 keeps the tether 315 taut and the DNV sensors 310 are fixed to the tether 315 such that constant distances are maintained between the buoy 305 and the DNV sensors 310. In some embodiments, the buoy 305 and the DNV sensors 310 move up and down with respect to the earth along with the level of the water 345, such as with tides, waves, etc. In alternative embodiments, the anchor 320 rests on the floor of the body of water 345, and the buoy 305 keeps the tether 315 taught because the buoy 305 is buoyant. In such embodiments, the buoy 305 may move with respect to the earth with movement of the water 345 caused, for example, tidal movements, currents, etc. In most embodiments, however, the buoy 305 and the DNV sensors 310 are not subject to sudden movements. As noted above, in some embodiments, an inertial compensation system can be used to compensate for movement of the DNV sensors 310 and/or the buoy 305. For example, the DNV sensors 310 may not always be aligned together. That is, some of the DNV sensors 310 may be tilted. In such an example, the inertial compensation system can adjust the measurements (e.g., the directional component of the vector measurement) to account for the tilt of the DNV sensors 310 such that the adjusted measurements are as if all of the DNV sensors 310 were aligned when the measurements were taken. In such embodiments, the DNV sensors 310 can include sensors that measure the orientation of the DNV sensors 310 (e.g., accelerometers).

Each of the DNV sensors 310 can be configured to take measurements of a magnetic field. For example, each of the DNV sensors 310 determine a vector measurement of the earth's magnetic field. The DNV sensors 310 take simultaneous measurements of the earth's magnetic field. The DNV sensors 310 can transmit the measured magnetic field to the buoy 305. In an illustrative embodiment, the buoy 305 compares the measurements from each of the DNV sensors 310. If the measurements are the same (or substantially the same), then the buoy 305 can determine that there is not a magnetic object nearby. If there is a difference that is above a threshold amount in either the direction or the magnitude of the sensed magnetic field, the buoy 305 can determine that there is a magnetic object nearby. In an alternative embodiment, the buoy 305 does not make such determinations, but transmits the measurements to a remote computing device that makes the determinations.

FIGS. 3A and 3B show the system 300 with and without a nearby magnetic object 325. The magnetic object 325 can be any suitable paramagnetic or ferromagnetic object such as a ship, a boat, a submarine, a drone, an airplane, a torpedo, a missile, etc. The magnetic flux lines 330 are the dashed lines of FIGS. 3A and 3B and are meant to a magnetic field for explanatory purposes. The magnetic flux lines 330 are meant to be illustrative and explanatory only and not meant to be limiting. In an illustrative embodiment, the magnetic flux lines 330 are representative of the earth's magnetic field. In an alternative embodiment, any suitable source of a magnetic field can be used other than the earth, such as an electromagnet, a permanent magnet, etc.

As shown in FIG. 3A, without the magnetic object 325, the magnetic flux lines 330 are straight and parallel. Thus, the angle of the magnetic flux lines 330 through each of the DNV sensors 310 may be the same. Accordingly, when the angles of the magnetic field sensed by each of the DNV sensors 310 are compared to one another, the angles will be the same and the buoy 305 can determine that there may be not a magnetic object (e.g., the magnetic object 325) nearby.

However, when a magnetic object 325 is nearby, as in the embodiment shown in FIG. 3B, the magnetic flux lines 330 can be disturbed and/or otherwise affected. The magnetic flux lines 330 of FIG. 3B do not pass through the DNV sensors 310 at the same angle. Rather, depending upon how far away from the buoy 305 that the DNV sensors 310 are, the angle of the magnetic flux lines 330 changes. Put another way, the angle of the magnetic field corresponding to the magnetic flux lines 330 may be not the same along the length of the tether 315. Thus, the sensed magnetic field angle by each of the DNV sensors 310 are not the same. Based on the difference in the magnetic field angle from the DNV sensors 310, the buoy 305 can determine that the magnetic object 325 may be nearby.

Similarly, the strength of the earth's magnetic field can be used to determine whether a magnetic object may be nearby. In the embodiment of FIG. 3A in which there is no magnetic object 325, the density of the magnetic field lines 330 may be consistent along the length of the tether 315. Thus, the magnitude of the magnetic field sensed by each of the DNV sensors 310 may be the same. However, when the magnetic object 325 disrupts the magnetic field, the density of the magnetic flux lines 330 along the tether 315 (e.g., at the multiple DNV sensors 310) may be not the same. Thus, the magnitude of the magnetic field sensed by each of the DNV sensors 310 may be not the same. Based on the differences in magnitude, the buoy 305 can determine that the magnetic object 325 may be nearby.

In an illustrative embodiment, the differences between the sensed magnetic field at each of the DNV sensors 310 can be used to determine the location and/or size of the magnetic object 325. For example, a larger magnetic object 325 will create larger differences in the magnetic field along the tether 315 (e.g., angle and magnitude) than a smaller magnetic object 325. Similarly, a magnetic object 325 that is closer to the tether 315 and the DNV sensors 310 will create larger differences than the same magnetic object 325 that may be further away.

In an illustrative embodiment, the DNV sensors 310 make multiple measurements over time. For example, each DNV sensor 310 can take a sample once per minute, once per second, once per millisecond, etc. The DNV sensors 310 can take their measurements simultaneously. In some instances, the magnitude and/or the direction of the earth's magnetic field can change over time. However, if each of the DNV sensors 310 sense the earth's magnetic field at the same time, the changes in the earth's magnetic field are negated. Changes in the earth's magnetic field (e.g., a background magnetic field) can be caused, for example, by solar flares. Thus, all of the DNV sensors 325 are affected the same by changes in the earth's magnetic field/the background magnetic field.

For example, the DNV sensors 310 each simultaneously take a first measurement of the earth's magnetic field. The buoy 305 can compare the first measurements of each of the DNV sensors 310 to determine if there may be a magnetic object 325 nearby. The earth's magnetic field can change and, subsequently, the DNV sensors 310 each simultaneously take a second measurement of the earth's magnetic field. The buoy 305 can compare the second measurements of each of the DNV sensors 310 to determine if there may be a magnetic object 325 nearby. In both the first and second measurement sets, the buoy 305 compares the respective measurements to each other. Thus, if there is a change in the earth's magnetic field, the system 300 is unaffected because each of the DNV sensors 310 sense the same changes. That is, if there is no magnetic object 325 nearby, then subtracting the measurement of one DNV sensor 310 from another is zero. This is true regardless of the strength or direction of the earth's magnetic field. Thus, the system 300 is unaffected if the earth's magnetic field changes from one measurement set to another.

In an illustrative embodiment, the buoy 305 includes one or more computer processors that use electrical power. The buoy 305 can include a battery to power various components such as the processors. In an illustrative embodiment, the battery of the buoy 305 powers the DNV sensors 310. In some embodiments, the buoy 305 can include one or more power generation systems for providing power to one or more of the various components of the system 300 such as the processors, the battery, the DNV sensors 310, etc. For example, the buoy 305 can include a solar panel, a tidal generator, or any other suitable power generation system.

In an illustrative embodiment, the buoy 305 includes a GPS sensor to determine the location of the buoy 305. The buoy 305 can transmit information such as the location of the buoy 305, an indication of whether a magnetic object may be nearby and/or where the magnetic object is, the measurements from the DNV sensors 310, etc. to a remote station via radio transmissions. The radio transmissions can be transmitted to a satellite, a base station, etc. via one or more antennas.

Although FIGS. 3A and 3B illustrate the buoy 305 and the DNV sensors 310 in water 345, alternative embodiments may include the buoy 305 and the DNV sensors 310 in any suitable substance. For example the, buoy 305 may be a balloon such as a weather balloon and the DNV sensors 310 may be suspended in the air. In another embodiment, the buoy 305 may be placed terrestrially and the DNV sensors 310 can be located underground. In some embodiments, the system 300 may be free-floating in space to detect, for example, satellites.

Figure 4:
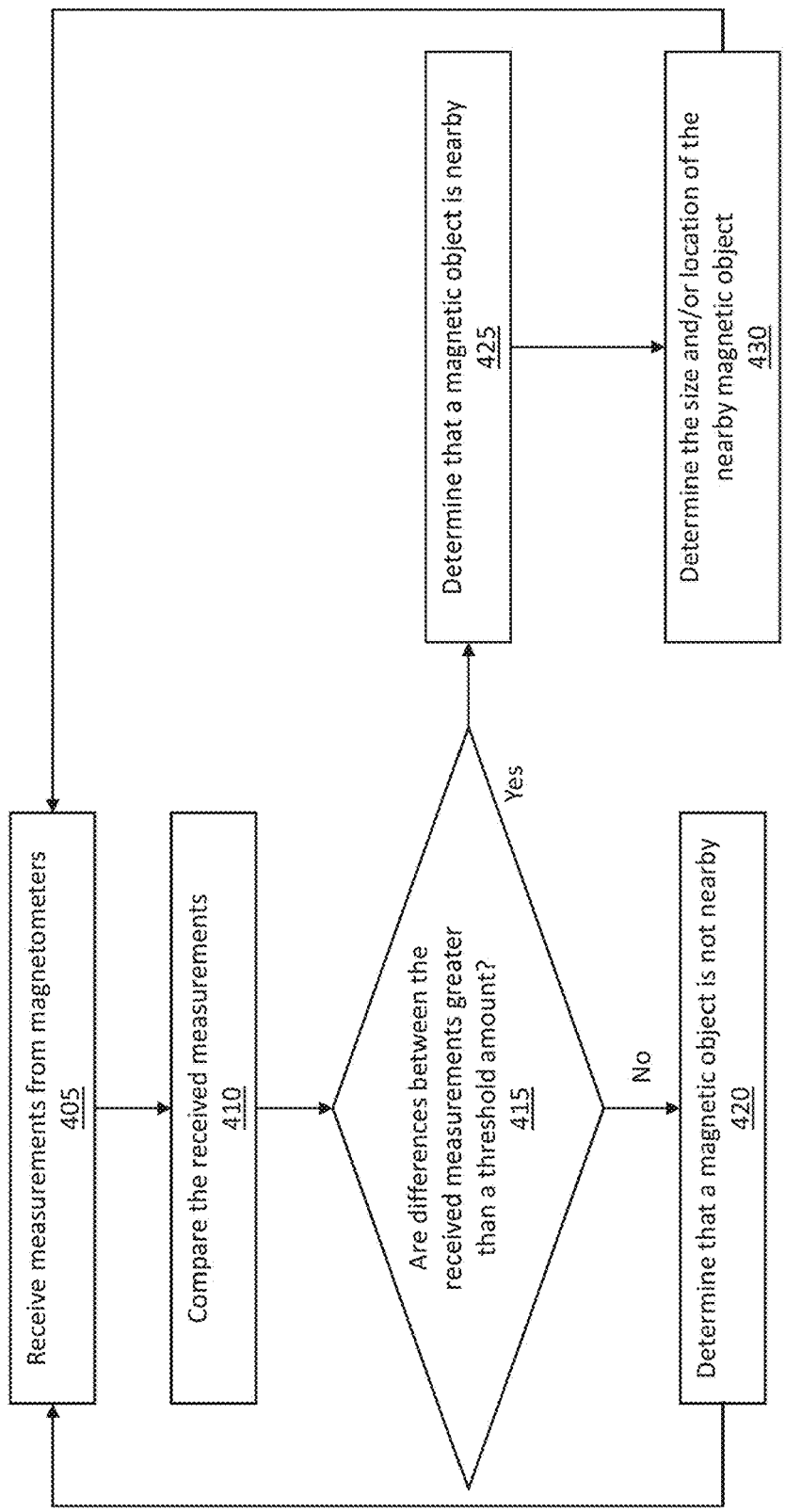
FIG. 4 is a flow chart of a method for monitoring for magnetic objects in accordance with some illustrative embodiments.

FIG. 4 is a flow chart of a method for monitoring for magnetic objects in accordance with some illustrative embodiments. In alternative embodiments, additional, fewer, and/or different elements may be used. Also, the used of a flow chart and/or arrows is not meant to be limiting with respect to the order of operations or flow of information. For example, in some embodiments, two or more operations may be performed simultaneously.

In an operation 405, measurements from magnetometers are received. For example, the buoy 305 can receive vector magnetic measurements taken by the DNV sensors 310. In some illustrative embodiments, the measurements are received simultaneously form multiple magnetometers. In some alternative embodiments, the magnetometers take simultaneous measurements, but the buoy 305 receives the measurements sequentially.

In an operation 410, the received measurements are compared. In some illustrative embodiments, the buoy subtracts a first measurement from a second measurement that were received in the operation 405. In embodiments in which more than two measurements are received in the operation 405, an arbitrary one of the measurements is used as a reference measurement, and the other measurements are compared to the reference measurement. In some alternative embodiments, all of the measurements are compared to all of the other measurements.

In an operation 415, it is determined whether the differences between the measurements are greater than a threshold amount. In some illustrative embodiments, each of the differences determined in the operation 415 are compared to a threshold amount. In embodiments in which the measurements are vector measurements, the differences in the angle are compared to an angle threshold amount, and the differences in the magnitude are compared to a magnitude threshold amount.

In some illustrative embodiments, if any of the differences are greater than the threshold amount, then the operation 415 determination is "yes." In some alternative embodiments, the determination of the operation 415 is "yes" if enough of the differences are above the threshold amount. For example, if more than 25% of the differences are greater than the threshold amount, then the determination of the operation 415 is "yes." In other embodiments, any suitable amount of differences can be used, such as 50%, 75%, etc.

If the determination of the operation 415 is not "yes," then in an operation 420, it is determined that there may not be a magnetic object nearby. The method 400 proceeds to the operation 405. If the determination of the operation 415 is "yes," then in an operation 425, it may be determined that a magnetic object (e.g., the magnetic object 325) is nearby.

In an operation 430, the size and/or location of the nearby magnetic object may be determined. For example, based on the differences in the angle and/or the magnitude of the measurements are used to determine the size and location of the magnetic object 325. In an illustrative embodiment, the determined differences are compared to a database of previously-determined magnetic objects. For example, magnetic objects of various sizes and at various distances can be measured by a system such as the system 300. The differences in the magnetometer measurements can be stored in connection with the size and location of the magnetic object. The differences determined in the operation 410 can be compared to the differences stored in the database to determine which size and location most closely matches with the differences stored in the database. In such an example, the size and location corresponding to the closest match may be determined to be the size and location of the magnetic object in the operation 430. In an illustrative embodiment, the database may be stored locally or may be stored remotely.

In embodiments in which the database may be stored remotely, the differences determined in the operation 410 can be transmitted to a remote computing device that can perform the operation 430. In an illustrative embodiment, the determination made in the operations 420, 425, and/or 430 are transmitted to a remote computing device (e.g., wirelessly). As shown in FIG. 4, the method 400 proceeds to the operation 405.

Figure 5:
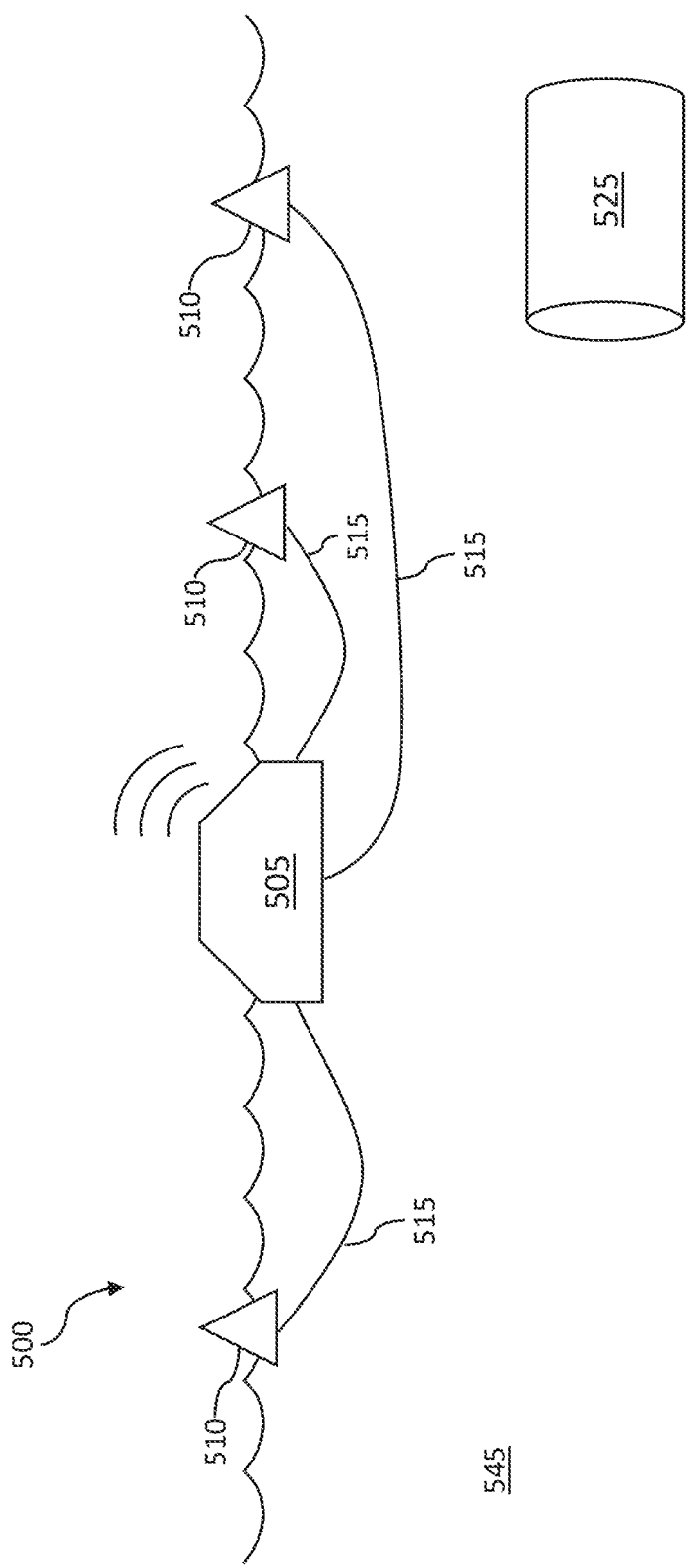
FIG. 5 is a diagram of a buoy-based DNV sensor array in accordance with some illustrative embodiments.

FIG. 5 is a diagram of a buoy-based DNV sensor array in accordance with some illustrative embodiments. The system 500 includes a buoy 505, DNV sensors 510, tethers 515, and a magnetic object 525. In alternative embodiments, additional, fewer, and/or different elements may be used. For example, although FIG. 5 illustrates an embodiment with three DNV sensors 510, any suitable number of DNV sensors 510 can be used such as two, four, five, ten, twenty, a hundred, etc. DNV sensors 510 can be used.

In some illustrative embodiments, the buoy 505 is similar to or the same as the buoy 305. The DNV sensors 510 are connected to the buoy 505 via the tethers 515. In some illustrative embodiments, the DNV sensors 510 communicate with the buoy 505 via their respective tethers 515. In alternative embodiments, the tethers 515 may not be used, and the DNV sensors 510 can communicate with the buoy via wireless communications.

In the embodiments shown in FIG. 5, the buoy 505 and the DNV sensors 510 float on the water 545. In alternative embodiments, any suitable arrangement may be used. For example, the buoy 505 and/or the DNV sensors 510 may sink to the floor of the body of water 545 (e.g., the sea floor). In alternative embodiments, the buoy 505 and/or the DNV sensors 510 may be suspended in the water 545. For example, the buoy 505 may float at the surface of the water 545, some of the DNV sensors 510 float on the surface of the water 545, and some of the DNV sensors 510 may be suspended within the column of water 545.

In an illustrative embodiment, each of the DNV sensors 510 can monitor their location. For example, the DNV sensors 510 can each include a GPS sensor that determines the geographical location of the respective DNV sensor 510. In another example, the buoy 505 and/or the DNV sensors 510 monitor the location of the DNV sensors 510 with respect to the buoy 505. For example, the direction that each DNV sensor 510 is from the buoy 505, the distance that each DNV sensor 510 is from the buoy 505, and/or the depth that each DNV sensor 510 is under the surface of the water 545 can be monitored.

In some illustrative embodiments, each of the DNV sensors 510 take a vector measurement of a magnetic field such as the earth's magnetic field. Each vector measurement includes an angular component and a magnitude. In some illustrative embodiments, each of the DNV sensors 510 takes a measurement of the magnetic field simultaneously. Each of the DNV sensors 510 transmit the measurement of the magnetic field to the buoy 505. The buoy 505 can store the multiple measurements together, such as a set. In illustrative embodiments, the buoy 505 stores the measurements locally on a storage device of the buoy 505. In an alternative embodiment, the buoy 505 causes the measurements to be stored remotely, such as on a remote server. For example, the buoy 505 can transmit the measurements wirelessly to a remote server or database.

In some illustrative embodiments, each of the DNV sensors 510 take multiple measurements over time. For example, the buoy 505 receives a first set of measurements from the DNV sensors 510, then a second set of measurements, etc. The first set of measurements can be compared to the second set of measurements. If there is a difference between the first set and the second set of measurements, then it can be determined that a magnetic object 525 may be nearby.

As mentioned above, the earth's magnetic field and/or the background magnetic field can change over time. Thus, in some instances, there are relatively minor differences between the first set of measurements and the second set of measurements because of the change in the earth's magnetic field. Accordingly, in an some illustrative embodiments, it may be determined that the magnetic object 325 is nearby if the differences between the first set of measurements and the second set of measurements is larger than a threshold amount. The threshold amount can be large enough that changes from the first set to the second set caused by the changes in the earth's magnetic field are ignored, but is small enough that changes caused by movement of the magnetic object 525 are larger than the threshold amount.

In some illustrative embodiments, the first set of measurements may be compared to the second set of measurements by comparing the measurements from respective DNV sensors 510. For example, the measurement form a first DNV sensor 510 in the first set may be compared to the measurement from the first DNV sensor 510 in the second set. In some illustrative embodiments, if the difference from the first set to the second set from any one of the DNV sensors 510 is above a threshold amount (e.g., the direction and/or the magnitude), then it is determined that the magnetic object 525 is nearby. In an alternative embodiment, the differences from each of the DNV sensors 510 are combined and if the combined differences are greater than the threshold amount, then it is determined that the magnetic object 525 is present.

For example, the DNV sensors 510 each take a measurement of the magnetic field once per second. The buoy 505 receives each of the measurements and stores them as sets of measurements. The most recently received set of measurements is compared to the previously received set of measurements. As the magnetic object 525 moves closer or moves around when in detection range, the magnetic object 525 disrupts the magnetic field. The DNV sensors 510 may be distributed around the buoy 505 and the magnetic field at the points detected by the DNV sensors 510 may be affected differently based on the location of the magnetic object 525. In an alternative embodiment, the vector measurements from each set are compared to one another, similar to the method described with respect to FIGS. 3 and 4.

In an illustrative embodiment, the size and/or location of the magnetic object 525 can be determined based on the changes from one set of measurements to another. For example, DNV sensors 510 can each send its location and the magnetic measurement. It can be determined that the DNV sensor 510 with the largest change in measurement is closest to the magnetic object 525. The amount of change in the DNV sensors 510 around the DNV sensor 510 with the largest change in measurement can be used to determine the direction of movement and the location of the magnetic object 525. For example, if the rate of change is increasing away from a baseline amount for a DNV sensor 510, it can be determined that the magnetic object 525 is approaching the DNV sensor 510.

Figure 6:
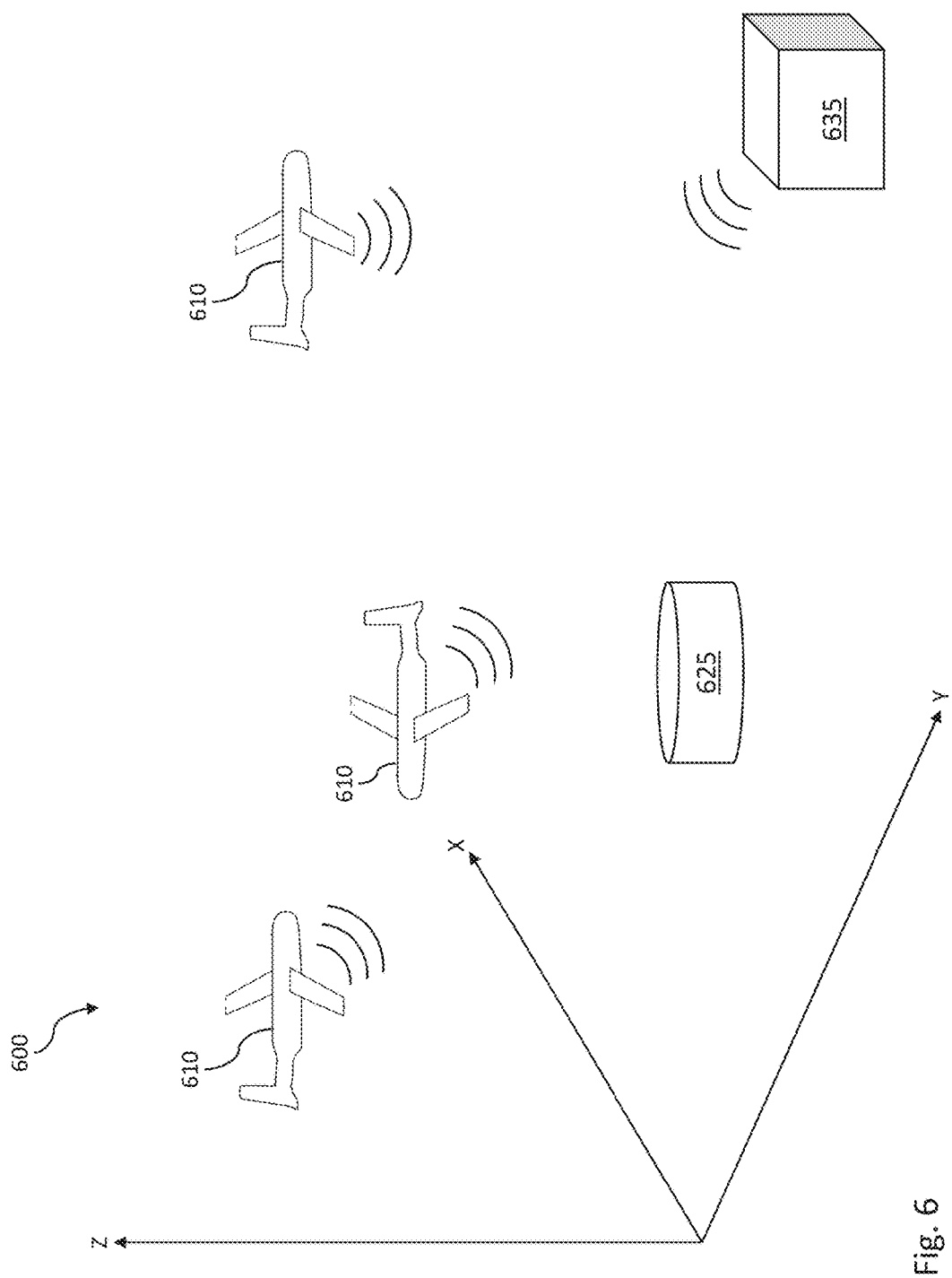
FIG. 6 is a diagram of an aerial DNV sensor array in accordance with some illustrative embodiments.

FIG. 6 is a diagram of an aerial DNV sensor array in accordance with an illustrative embodiment. An illustrative system 600 includes unmanned aerial systems (UASs), a magnetic object 625, and a central processing unit 635. In an illustrative embodiment, one DNV sensor is mounted to each UAS 610. In an alternative embodiment, each UAS 610 has multiple DNV sensors mounted thereto. In alternative embodiments, additional, fewer, and/or different elements may be used. For example, although three UASs 610 are shown in FIG. 6, alternative embodiments may use two, four, five, six, ten, twenty, one hundred, etc. UASs 610.

In an illustrative embodiment, inertial stabilization and/or compensation can be used for the DNV sensors on the UASs 610. For example, one or more gyroscopic inertial stabilization systems can be used to reduce the vibration and/or to compensate for the movement of the UAS 610. For example, the UAS 610 may lean to the right with respect to the earth, but the inertial stabilization system can cause the DNV sensor to remain parallel (or in any other suitable position) with respect to the earth.

In an illustrative embodiment, an inertial compensation system can be used on the UASs 610. For example, a sensor can monitor the vibration and/or position of the body of the UAS 610. The DNV sensor can be securely attached to the body of the UAS 610. The sensed vibration and/or position of the body can be used to augment the vector reading from the DNV sensor. For example, a first DNV vector measurement may be taken when the UAS 610 is parallel to the earth. A second DNV sensor vector measurement may be taken with the UAS 610 is leaning to the right with respect to the earth. The inertial compensation system can adjust the vector measurement of the second DNV sensor measurement such that the measurement is as if the UAS 610 was parallel with respect to the earth. For example, the a compensation angle can be added to the angle component of the vector measurement.

In an illustrative embodiment, the UASs 610 can be used to detect and locate the magnetic object 625. The magnetic object 625 can be any suitable paramagnetic or ferromagnetic object or any suitable device that generates a magnetic field, such as a ship, a boat, a submarine, a drone, an airplane, a torpedo, a missile, a tank, a truck, a car, land mines, underwater mines, railroad tracks, pipelines, electrical lines, etc.

In some illustrative embodiments, the earth's magnetic field of an area can be mapped and stored in a database, such as at the central processing unit 635. For example, the UASs 610 can fly around the area and each take multiple magnetometer readings across the area to determine a baseline magnetic field of the area. In some illustrative embodiments, once a baseline map of the area has been determined, the UASs 610 can monitor the area for changes from the baseline map. For example, after a baseline map is generated, a second map of the area can be generated. In some illustrative embodiments, the baseline map and the second map include measurement locations that are the same. The baseline map and the second map can be compared to one another. If there has been movement from a magnetic object (e.g., the magnetic object 625), then the baseline map and the second map will have differences. If there is no movement from the magnetic object 625, then the baseline map and the second map will be largely the same.

As noted above, a measurement of the earth's magnetic field can include interference from various sources and/or changes over time. However, in some instances, the changes over time are gradual and relatively slow. Thus, in some illustrative embodiments, the baseline map and the second map can be generated relatively close in time to one another. That is, the closer that the baseline map and the second map are generated, the differences from the baseline map and the second map will be caused more from the magnetic object 625 rather than changes in the earth's magnetic field. To put it another way, common mode rejection or moving target indication processing can be used to determine that the magnetic object 625 is moving.

However, in some embodiments, the interference or noise can be removed from the measurements of the UASs 610. That is, the measurements from the UASs 610 can be taken simultaneously (e.g., be time-aligned). Thus, the measurements from each of the UASs 610 are affected the same from the interference sources (e.g., the sun). Any suitable common-mode rejection techniques can be used, such as using Fourier transforms (e.g., fast-Fourier transforms (FFT)) or other frequency-domain methods for identifying and removing frequencies that are not consistent over time (e.g., not the earth's magnetic field frequency). In some instances, the multiple measurements can be subtracted from one another in the time domain to identify (and remove) the noise.

In some embodiments, noise in the various measurements will cancel statistically because the noise is uncorrelated. Thus, comparing a baseline map to additional vector measurements (e.g., a second map), motion of the magnetic object 625 can be detected. By analyzing the changes in the magnetic field, the direction of movement of the magnetic object 625 can be determined. Similarly, based on the changes in the detected earth's magnetic field, additional details of the magnetic object 625 can be determined. For example, the size and/or dimensions of the magnetic object 625 can be determined. In some instances, based on the changes in the earth's magnetic field, the magnetic object 625 can be classified as a type of a magnetic object (e.g., a vehicle, a generator, a motor, a submarine, a boat, etc.).

In some embodiments, the earth's magnetic lines will form distinct patterns around metallic and/or magnetic objects. Such patterns can be mapped (e.g., using the UASs 610) and compared to previously-determined patterns corresponding to known objects to determine what the object is. Such a technique may be used regardless of whether the object is moving. For example, for a large object such as a submarine, a single mapping of the earth's magnetic field may be used to determine that the object is a submarine based on the pattern of the earth's magnetic field lines. In such an example, it may also be determined that the disturbances in the earth's magnetic field lines are caused by an object of interest (e.g., the submarine) because no other metallic objects are around (e.g., there are no steel buildings in the middle of the ocean).

In some embodiments, the UASs 610 fly around the area that was previously mapped. Each of the UASs 610 transmits their measurement and location to the central processing unit 635. The UASs 610 can determine their location using any suitable method, such as GPS, celestial or stellar navigation, radio or LORAN navigation, etc. The location of the UASs 610 can include a coordinate (e.g., latitude and longitude) and an elevation. In such embodiments, the location of the UASs 610 can be a three-dimensional location. In an illustrative embodiment, the central processing unit 635 can determine the location of each of the UASs 610. For example, each of the UASs 610 can transmit a message at the same time. Based on the time that the message reaches the central processing unit 635 (e.g., the travel time of the message) and the direction from which the message was received, the central processing unit 635 can determine the location of each of the UASs 610. In alternative embodiments, any suitable method of monitoring the location of the UASs 610 can be used.

In some embodiments, the central processing unit 635 can compare the received measurement from each of the UASs 610 with the magnetic field of the baseline map corresponding to the location of the respective UAS 610. For example, the central processing unit 635 can receive a measurement and a location from a UAS 610. The central processing unit 635 can determine or look up an expected magnetic field measurement based on the location of the UAS 610 and the previously-determined magnetic field map. If the difference between the expected measurement and the received measurement is above a threshold amount, it can be determined that the magnetic object 625 is not within the monitored area.

In some instances, the magnetic object 625 creates a magnetic field. For example, engines or motors can create magnetic fields. In some embodiments, the magnetic object 625 is a direct-current motor that creates a magnetic field. In some embodiments, the magnetic field of the magnetic object 625 can be detected by the UASs 610.

In some illustrative embodiments, the magnetic object 625 creates a magnetic field that is detected by two or more of the UASs 610. For example, the previously-determined magnetic map of the area can be used to subtract the earth's magnetic field (or any other background magnetic field) from the measurement, thereby leaving the magnetic field generated by the magnetic object 625. For example, the expected magnetic measurement is a vector measurement determined from a pre-determined map and the location of the UAS 610. The measurement from the UAS 610 is also a vector. The pre-determined vector measurement can be subtracted from the vector measurement of the UAS 610. The resultant vector can be used to determine the location of the magnetic object 625. For example, the vector direction from the location of the UAS 610 can be used to determine the location of the magnetic object 625 by determining the intersection of the earth's surface and the vector direction. In such an example, it is assumed that the magnetic object 625 is on the surface of the earth's surface.

In some illustrative embodiments, the magnetic object 625 creates a unique magnetic field that can be used to determine what the magnetic object 625 is. For example, a direct current motor may have a magnetic signature that is different than an automobile engine. The magnetic field of the magnetic object 625 can be detected and the magnetic signature of the magnetic object 625 can be used to identify the magnetic object 625. In some embodiments, the magnetic field of the magnetic object 625 is distinguished from the earth's magnetic field (e.g., by subtraction of a baseline map and a second map).

In another example, the magnetic field from the magnetic object 625 can be measured from two (or more) UASs 610. Di-lateration (or multilateration) can be used to determine the location of the magnetic object 625. For example, based on the determined vector of the magnetic object from the location of each of the UASs 610, the location of the magnetic object 625 can be determined to be the intersection of the vector directions.

In some illustrative embodiments, the system 600 can be used to map large magnetic objects. For example, oil fields have subterranean oil spread over large areas. Like the earth's oceans, the oil in the oil fields are affected by tides. That is, the body of oil flows from one end of the oil field to the other. Thus, the depth of the oil field changes throughout a day based on the tidal flow of the oil. Accordingly, the effect on the earth's magnetic field sensed above ground over the oil field changes throughout the day based on the tidal flow of the oil. In an illustrative embodiment, the UASs 610 can fly around an area and monitor the change in the sensed earth's magnetic field. For areas above the oil field with oil, the earth's magnetic field as sensed by the UASs 610 will fluctuate on a cycle that is similar to the tidal cycle of the oceans. For areas that are not above the oil, the earth's magnetic field will not be affected on a tidal cycle. Accordingly, by monitoring the sensed earth's magnetic field over a period of time such as 12 hours, 24 hours, 36 hours, two days, three days, a week, etc. over an area, it can be determined where the oil field is (e.g., where the oil is) by determining which areas have tidal changes in the sensed earth's magnetic field.

Although FIG. 6 illustrates the UASs 610 as aerial devices, any other suitable dirigible or device may be used. For example, DNV sensors may be attached to autonomous cars or other terrestrial vehicles. In another example, DNV sensors may be attached to autonomous ships or submarines. In alternative embodiments, the devices may not be autonomous but may be remotely controlled (e.g., by the central processing unit). In yet other embodiments, the devices may controlled in any suitable fashion, such as via an onboard pilot. Embodiments of the teachings described herein need not be limited to certain types of vehicles.

Figure 7:
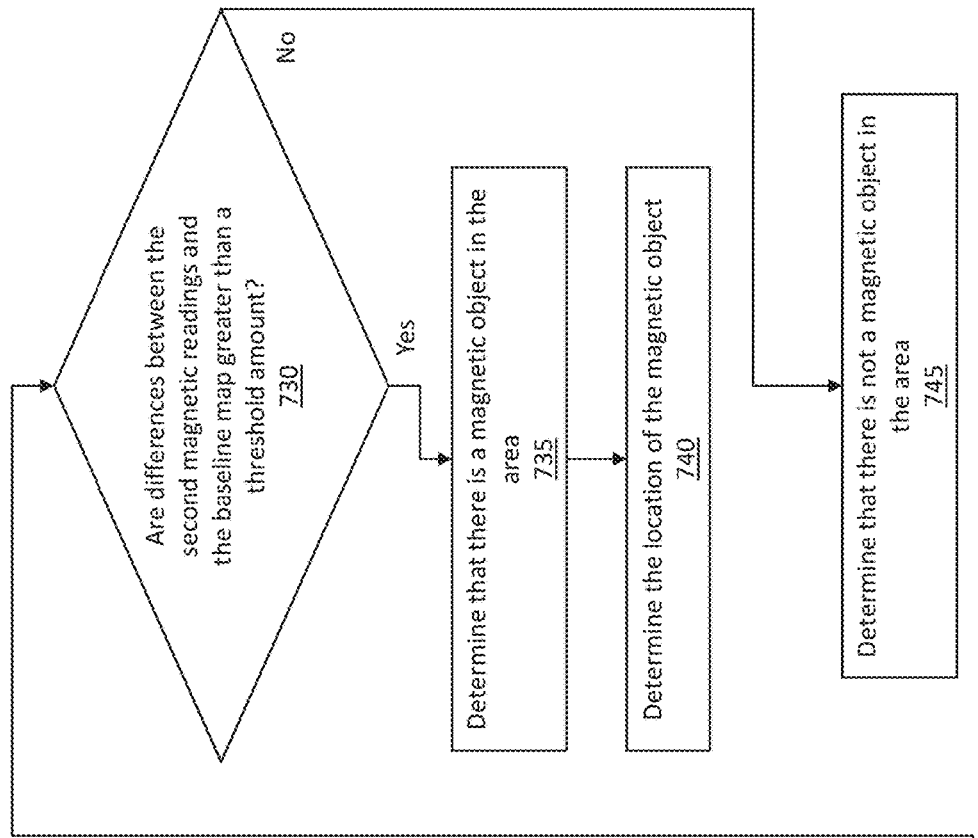
FIG. 7 is a flow chart of a method for monitoring for magnetic objects in accordance with some illustrative embodiments.
Figure 7:
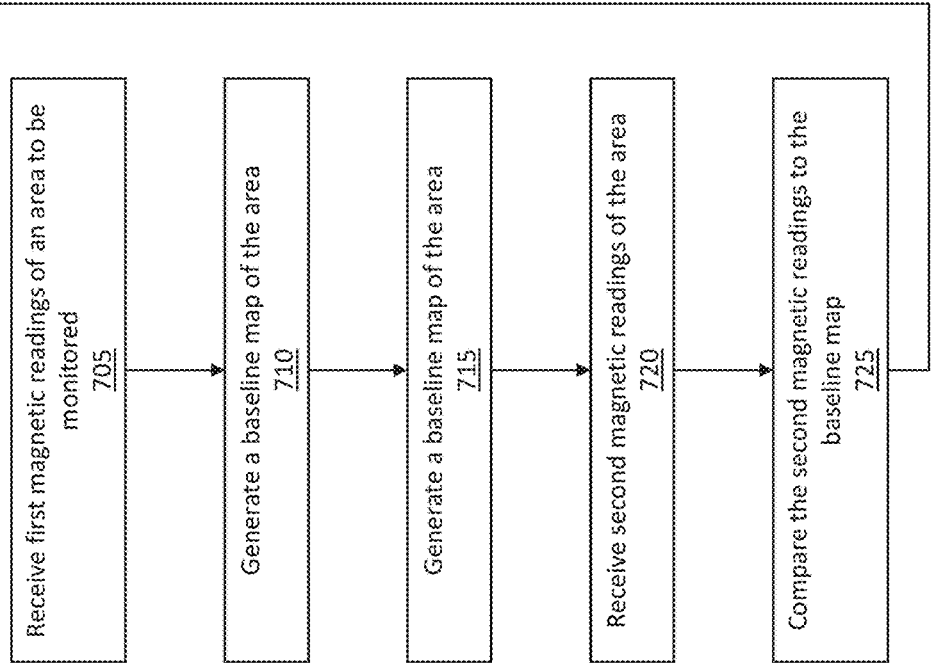

FIG. 7 is a flow chart of a method for monitoring for magnetic objects in accordance with an illustrative embodiment. In alternative embodiments, additional, fewer, and/or different elements may be used. Also, the used of a flow chart and/or arrows is not meant to be limiting with respect to the order of operations or flow of information. For example, in some embodiments, two or more operations may be performed simultaneously.

In an operation 705, first magnetic readings of an area to be monitored are received. For example, the UASs 610 can fly around the area to be monitored. Each of the UASs 610 can take a magnetic measurement using, for example, a DNV sensor, and the UASs 610 can transmit to the central processing unit 635 the magnetic reading and the location of the respective UAS 610 when the reading was taken. In an operation 710, the first magnetic readings received in the operation 705 is used to generate a baseline map of the area. For example, each of the measurements can be stored in connection with the three-dimensional location. In some instances the individual measurements can be averaged over the space to create the baseline map.

In an operation 720, second magnetic readings of the area are received. For example, the UASs 610 can fly around the area and monitor the magnetic field of the area. The measured magnetic field and the location of the respective UAS 610 can be transmitted to the central processing unit 635. In an operation 725, the second magnetic readings are compared to the baseline map. For example, a measurement received from a UAS 610 and the measurement is compared to a measurement from the baseline map corresponding to the location of the UAS 610.

In an operation 730, it is determined whether differences between the second magnetic readings and the baseline map are greater than a threshold amount. In an illustrative embodiment, if the received differences in either the magnitude or the direction of the second magnetic readings and the baseline map are greater than a threshold amount, then it is determined in an operation 735 that there is a magnetic object in the area. If not, then in the operation 745, it is determined that there is not a magnetic object in the area.

In an operation 740, the location of the magnetic object is determined. In an illustrative embodiment, the difference in the direction from two or more UAS 610 measurements and the direction of the stored baseline map can be used to determine the location of the magnetic object. Any suitable technique for determining the location of the magnetic object can be used, such as di-lateration, multilateration, triangulation, etc.

Figure 8:
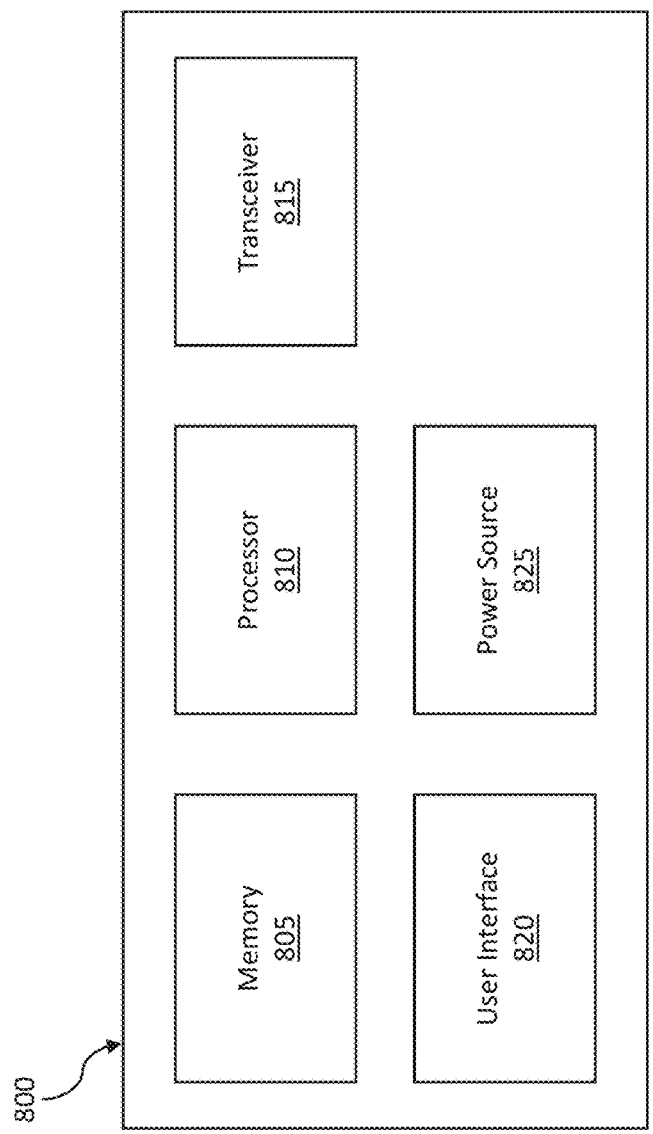
FIG. 8 is a block diagram of a computing device in accordance with some illustrative embodiments.

FIG. 8 is a block diagram of a computing device in accordance with an illustrative embodiment. An illustrative computing device 800 includes a memory 805, a processor 810, a transceiver 815, a user interface 820, and a power source 825. In alternative embodiments, additional, fewer, and/or different elements may be used. The computing device 800 can be any suitable device described herein. For example, the computing device 800 can be a desktop computer, a laptop computer, a smartphone, a specialized computing device, etc. The computing device 800 can be used to implement one or more of the methods described herein.

In an illustrative embodiment, the memory 805 is an electronic holding place or storage for information so that the information can be accessed by the processor 810. The memory 805 can include, but is not limited to, any type of random access memory (RAM), any type of read only memory (ROM), any type of flash memory, etc. such as magnetic storage devices (e.g., hard disk, floppy disk, magnetic strips, etc.), optical disks (e.g., compact disk (CD), digital versatile disk (DVD), etc.), smart cards, flash memory devices, etc. The computing device 800 may have one or more computer-readable media that use the same or a different memory media technology. The computing device 800 may have one or more drives that support the loading of a memory medium such as a CD, a DVD, a flash memory card, etc.

In an illustrative embodiment, the processor 810 executes instructions. The instructions may be carried out by a special purpose computer, logic circuits, or hardware circuits. The processor 810 may be implemented in hardware, firmware, software, or any combination thereof. The term "execution" is, for example, the process of running an application or the carrying out of the operation called for by an instruction. The instructions may be written using one or more programming language, scripting language, assembly language, etc. The processor 810 executes an instruction, meaning that it performs the operations called for by that instruction. The processor 810 operably couples with the user interface 820, the transceiver 815, the memory 805, etc. to receive, to send, and to process information and to control the operations of the computing device 800. The processor 810 may retrieve a set of instructions from a permanent memory device such as a ROM device and copy the instructions in an executable form to a temporary memory device that is generally some form of RAM. An illustrative computing device 800 may include a plurality of processors that use the same or a different processing technology. In an illustrative embodiment, the instructions may be stored in memory 805.

In an illustrative embodiment, the transceiver 815 is configured to receive and/or transmit information. In some embodiments, the transceiver 815 communicates information via a wired connection, such as an Ethernet connection, one or more twisted pair wires, coaxial cables, fiber optic cables, etc. In some embodiments, the transceiver 815 communicates information via a wireless connection using microwaves, infrared waves, radio waves, spread spectrum technologies, satellites, etc. The transceiver 815 can be configured to communicate with another device using cellular networks, local area networks, wide area networks, the Internet, etc. In some embodiments, one or more of the elements of the computing device 800 communicate via wired or wireless communications. In some embodiments, the transceiver 815 provides an interface for presenting information from the computing device 800 to external systems, users, or memory. For example, the transceiver 815 may include an interface to a display, a printer, a speaker, etc. In an illustrative embodiment, the transceiver 815 may also include alarm/indicator lights, a network interface, a disk drive, a computer memory device, etc. In an illustrative embodiment, the transceiver 815 can receive information from external systems, users, memory, etc.

In an illustrative embodiment, the user interface 820 is configured to receive and/or provide information from/to a user. The user interface 820 can be any suitable user interface. The user interface 820 can be an interface for receiving user input and/or machine instructions for entry into the computing device 800. The user interface 820 may use various input technologies including, but not limited to, a keyboard, a stylus and/or touch screen, a mouse, a track ball, a keypad, a microphone, voice recognition, motion recognition, disk drives, remote controllers, input ports, one or more buttons, dials, joysticks, etc. to allow an external source, such as a user, to enter information into the computing device 800. The user interface 820 can be used to navigate menus, adjust options, adjust settings, adjust display, etc.

The user interface 820 can be configured to provide an interface for presenting information from the computing device 800 to external systems, users, memory, etc. For example, the user interface 820 can include an interface for a display, a printer, a speaker, alarm/indicator lights, a network interface, a disk drive, a computer memory device, etc. The user interface 820 can include a color display, a cathode-ray tube (CRT), a liquid crystal display (LCD), a plasma display, an organic light-emitting diode (OLED) display, etc.

In an illustrative embodiment, the power source 825 is configured to provide electrical power to one or more elements of the computing device 800. In some embodiments, the power source 825 includes an alternating power source, such as available line voltage (e.g., 120 Volts alternating current at 60 Hertz in the United States). The power source 825 can include one or more transformers, rectifiers, etc. to convert electrical power into power useable by the one or more elements of the computing device 800, such as 1.5 Volts, 8 Volts, 12 Volts, 24 Volts, etc. The power source 825 can include one or more batteries.

In an illustrative embodiment, any of the operations described herein can be implemented at least in part as computer-readable instructions stored on a computer-readable memory. Upon execution of the computer-readable instructions by a processor, the computer-readable instructions can cause a node to perform the operations.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A system comprising:
    a plurality of unmanned aerial systems (UASs);
    a plurality of magnetometers each attached to a respective one of the UASs, wherein each of the magnetometers is configured to generate a vector measurement of a magnetic field from the location of the associated UAS while in motion at a particular time; and
    a central processing unit in communication with each of the plurality of magnetometers, wherein the central processing unit is configured to:
        receive, from each of the plurality of magnetometers, a first set of vector measurements and corresponding locations of such first set of vector measurements, wherein the corresponding locations indicate where a respective magnetometer was located when the respective vector measurement of the first set of vector measurements was taken;
        generate a magnetic baseline map using the first set of vector measurements;
        receive, from a first magnetometer of the plurality of magnetometers, a first vector measurement and a first corresponding location;
        compare the first vector measurement with the magnetic baseline map using the first corresponding location to determine a first difference vector, wherein the magnetometers are sensitive enough to detect relatively small changes in the first vector measurement relative to the first set of vector measurements based upon fluorescence from a magneto-optical defect center material; and
        determine that a magnetic object is in an area corresponding to the area of the magnetic baseline map based on the first difference vector.

2. The system of claim 1, wherein the plurality of magnetometers are diamonds nitrogen-vacancy (DNV) sensors.

3. The system of claim 1, wherein the central processing unit is further configured to determine a location of the magnetic object based on the first difference vector.

4. The system of claim 3, wherein to determine the location of the magnetic object, the central processing unit is configured to determine a point on a surface of the earth that is in an orthogonal direction from the first difference vector.

5. The system of claim 1, wherein the central processing unit is further configured to:
    receive, from a second magnetometer of the plurality of magnetometers, a second vector measurement and a second corresponding location; and
    compare the second vector measurement with the magnetic baseline map using the second corresponding location to determine a second difference vector,
    wherein to determine that the magnetic object is in the area corresponding to the area of the magnetic baseline map, the central processing unit is configured to determine a location of the magnetic object based on the first difference vector and the second difference vector.

6. The system of claim 5, wherein the first vector measurement and the second vector measurement were taken simultaneously.

7. The system of claim 1, wherein each of the magnetometers are attached to the respective UAS via an inertial compensation device.

8. The system of claim 1, wherein the central processing unit is further configured to:

cause a UAS corresponding to the first magnetometer to move to a new location;

receive from the first magnetometer a third vector measurement and a third corresponding location, wherein the third corresponding location is the new location of the UAS corresponding to the first magnetometer;

compare the third vector measurement with the magnetic baseline map using the third corresponding location to determine a third difference vector; and determine a location of the magnetic object based on the first difference vector and the third difference vector.

9. The system of claim 8, wherein the central processing unit is further configured to determine a type of the magnetic object by comparing the first difference vector and the third difference vector to a database of previously-determined magnetic object types.

10. The system of claim 9, wherein the database of previously-determined magnetic object types comprises a magnetic signature for each of the previously-determined magnetic object types.

11. The system of claim 1, wherein the magnetic object does not generate a magnetic field.

12. The system of claim 11, wherein the magnetic object alters a portion of the earth's magnetic field, and wherein the first difference vector corresponds to the portion of the earth's magnetic field that is altered by the magnetic field.

13. The system of claim 1, wherein the magnetic object generates the magnetic field, and wherein the first difference vector corresponds to the magnetic field.

14. A method comprising:

receiving, from each of a plurality of magnetometers, a first set of vector measurements and corresponding locations, wherein each of the magnetometers is attached to one of a plurality of unmanned aerial systems (UASs), wherein each of the magnetometers is configured to generate a vector measurement of a magnetic field from the location of the associated UAS while in motion at a particular time, and wherein the corresponding locations indicate where a respective magnetometer was when the respective vector measurement of the first set of vector measurements was taken;

generating a magnetic baseline map using the first set of vector measurements;

receiving, from a first magnetometer of the plurality of magnetometers, a first vector measurement and a first corresponding location;

comparing the first vector measurement with the magnetic baseline map using the first corresponding location to determine a first difference vector, wherein the magnetometers are sensitive enough to detect relatively small changes in the first vector measurement relative to the first set of vector measurements based upon fluorescence from a magneto-optical defect center material; and determining that a magnetic object is in an area corresponding to the area of the magnetic baseline map based on the first difference vector.

15. The method of claim 14, further comprising determining a location of the magnetic object based on the first difference vector.

16. The method of claim 14, further including:

receiving, from a second magnetometer of the plurality of magnetometers, a second vector measurement and a second corresponding location; and comparing the second vector measurement with the magnetic baseline map using the second corresponding location to determine a second difference vector, wherein determining that the magnetic object is in the area corresponding to the area of the magnetic baseline map comprises determining a location of the magnetic object based on the first difference vector and the second difference vector.

17. The method of claim 16, wherein the first vector measurement and the second vector measurement were taken simultaneously.

18. The method of claim 14, further comprising:

causing a UAS corresponding to the first magnetometer to move to a new location;

receiving from the first magnetometer a third vector measurement and a third corresponding location, wherein the third corresponding location is the new location of the UAS corresponding to the first magnetometer;

comparing the third vector measurement with the magnetic baseline map using the third corresponding location to determine a third difference vector; and determining a location of the magnetic object based on the first difference vector and the third difference vector.

19. The method of claim 18, further comprising determining a type of the magnetic object by comparing the first difference vector and the third difference vector to a database of previously-determined magnetic object types.

20. The method of claim 19, wherein the database of previously-determined magnetic object types comprises a magnetic signature for each of the previously-determined magnetic object types.

* * * * *